(12) United States Patent
Moon et al.

(10) Patent No.: US 10,998,478 B2
(45) Date of Patent: May 4, 2021

(54) LIGHT-EMITTING ELEMENT, LIGHT-EMITTING ELEMENT PACKAGE COMPRISING LIGHT-EMITTING ELEMENT, AND LIGHT-EMITTING DEVICE COMPRISING LIGHT-EMITTING ELEMENT PACKAGE

(71) Applicant: LG INNOTEK CO., LTD., Seoul (KR)

(72) Inventors: Ji Hyung Moon, Seoul (KR); Woo Sik Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 18 days.

(21) Appl. No.: 15/753,233

(22) PCT Filed: Aug. 18, 2016

(86) PCT No.: PCT/KR2016/009121
§ 371 (c)(1),
(2) Date: Feb. 16, 2018

(87) PCT Pub. No.: WO2017/030396
PCT Pub. Date: Feb. 23, 2017

(65) Prior Publication Data
US 2018/0240952 A1 Aug. 23, 2018

(30) Foreign Application Priority Data

Aug. 18, 2015 (KR) .................. 10-2015-0115809
Aug. 18, 2015 (KR) .................. 10-2015-0115810

(51) Int. Cl.
*H01L 29/45* (2006.01)
*H01L 21/441* (2006.01)
(Continued)

(52) U.S. Cl.
CPC ............ *H01L 33/62* (2013.01); *H01L 33/382* (2013.01); *H01L 33/387* (2013.01); *H01L 24/24* (2013.01);
(Continued)

(58) Field of Classification Search
CPC ..... H01L 33/382; H01L 33/20; H01L 33/387; H01L 33/44; H01L 33/32; H01L 33/46;
(Continued)

(56) References Cited

U.S. PATENT DOCUMENTS 7,436,066 B2 * 10/2008 Sonobe .................. H01L 33/40
257/762
7,906,788 B2 * 3/2011 Nagai ................. H01L 25/0753
257/88
(Continued)

FOREIGN PATENT DOCUMENTS

CN 104813490 A 7/2015
JP 2003-86842 A 3/2003
(Continued)

OTHER PUBLICATIONS

International Search Report (PCT/ISA/210) issued in PCT/KR2016/009121, dated Nov. 24, 2016.

*Primary Examiner* — Mary A Wilczewski
*Assistant Examiner* — Tsz K Chiu
(74) *Attorney, Agent, or Firm* — Birch, Stewart, Kolasch & Birch LLP

(57) ABSTRACT

A light-emitting element according to an embodiment comprises: a substrate; a light-emitting structure comprising a first conductive semiconductor layer, an active layer, a second conductive semiconductor layer, which are successively arranged on the substrate; and first and second electrodes, which are electrically connected to the first and second conductive semiconductor layers, respectively, (Continued)

wherein the first electrode comprises at least one first contact portion arranged on the first conductive semiconductor layer, which is exposed to at least a part of a first area of the light-emitting structure, and connected to the first conductive semiconductor layer, and a plurality of second contact portions connected to the first conductive semiconductor layer that is exposed in a second area, which is positioned, on a plane, closer to the inner side than the first area of the light-emitting structure, and the second electrode comprises a third contact part, which is arranged in the second area of the light-emitting structure, and which is connected to the second conductive semiconductor layer.

18 Claims, 12 Drawing Sheets

(51) Int. Cl.
*H01L 33/62* (2010.01)
*H01L 33/38* (2010.01)
*H01L 33/44* (2010.01)
*H01L 33/20* (2010.01)
*H01L 23/00* (2006.01)
*H01L 31/0304* (2006.01)
*H01L 31/0352* (2006.01)
*H01L 33/40* (2010.01)
*H01L 33/42* (2010.01)

(52) U.S. Cl.
CPC ........ *H01L 24/95* (2013.01); *H01L 31/03044* (2013.01); *H01L 31/035281* (2013.01); *H01L 33/20* (2013.01); *H01L 33/405* (2013.01); *H01L 33/42* (2013.01); *H01L 33/44* (2013.01); *H01L 2224/24137* (2013.01); *H01L 2224/32225* (2013.01); *H01L 2224/73267* (2013.01); *H01L 2924/12042* (2013.01); *H01L 2924/14* (2013.01); *H01L 2933/0016* (2013.01)

(58) Field of Classification Search
CPC ......... H01L 33/42; H01L 24/24; H01L 24/95; H01L 27/3281; H01L 31/03044; H01L 31/035281; H01L 31/068; H01L 31/0475; H01L 31/1876; H01L 33/005; H01L 33/38; H01L 2224/24137; H01L 2224/32225; H01L 2224/73267; H01L 2224/95101; H01L 2924/14; H01L 2924/12042; H01L 2924/1305; H01L 2924/13034; H01L 2924/13033; H01L 2924/1306; H01L 2924/13062; H01L 2924/12041; H01L 2924/13091; H01L 2924/09701

See application file for complete search history.

(56) References Cited

U.S. PATENT DOCUMENTS

| | | | | |
|---|---|---|---|---|
| 8,110,421 B2* | 2/2012 | Sugizaki | ................ | H01L 33/44 257/98 |
| 8,174,038 B2* | 5/2012 | Hoshina | ................ | H01L 33/54 257/98 |
| 8,274,070 B2* | 9/2012 | Kamiya | ................ | H01L 33/42 257/13 |
| 8,546,836 B2* | 10/2013 | Kamiya | ................ | H01L 33/20 257/99 |
| 8,895,957 B2* | 11/2014 | Lee | ................ | H01L 27/15 257/13 |
| 9,070,851 B2* | 6/2015 | Seo | ................ | H01L 33/10 |
| 9,293,660 B2* | 3/2016 | Chae | ................ | H01L 33/38 |
| 9,362,348 B2* | 6/2016 | Lowenthal | ................ | H01L 31/1876 |
| 9,400,086 B2* | 7/2016 | Lowenthal | ................ | F21V 7/0066 |
| 9,461,212 B2* | 10/2016 | Chae | ................ | H01L 33/502 |
| 2006/0001035 A1* | 1/2006 | Suehiro | ................ | H01L 33/38 257/91 |
| 2006/0071228 A1* | 4/2006 | Sun | ................ | H01L 33/005 257/99 |
| 2006/0192223 A1 | 8/2006 | Lee et al. | | |
| 2008/0096297 A1* | 4/2008 | Schiaffino | ................ | H01L 33/382 438/22 |
| 2010/0012968 A1* | 1/2010 | Yahata | ................ | H01L 33/58 257/99 |
| 2010/0078671 A1 | 4/2010 | Huang et al. | | |
| 2014/0203314 A1* | 7/2014 | Kojima | ................ | H01L 33/504 257/98 |
| 2015/0311415 A1 | 10/2015 | Song et al. | | |
| 2018/0277719 A1* | 9/2018 | Lee | ................ | H01L 33/06 |

FOREIGN PATENT DOCUMENTS

| | | |
|---|---|---|
| JP | 2010-27919 A | 2/2010 |
| KR | 10-2012-0016830 A | 2/2012 |
| KR | 10-2015-0066186 A | 6/2015 |
| KR | 10-2015-0067566 A | 6/2015 |
| WO | WO 2014/003346 A1 | 1/2014 |

\* cited by examiner

[FIG. 1]
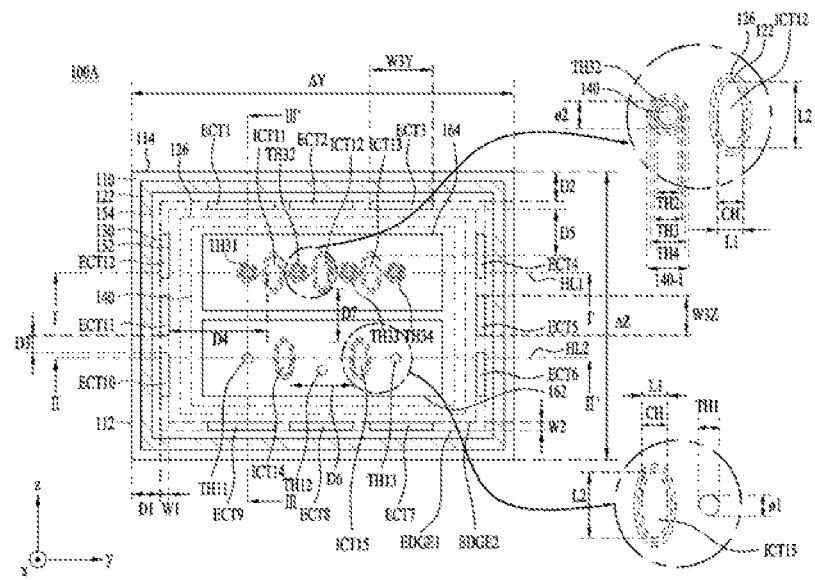
[FIG. 2]
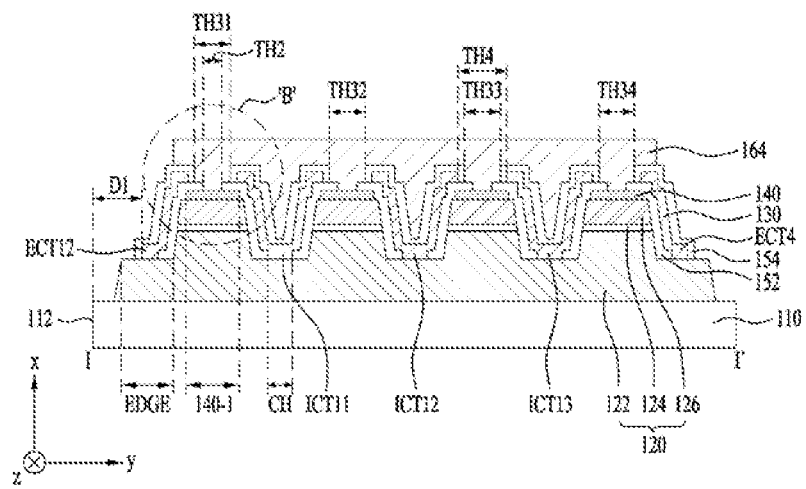

[FIG. 3]
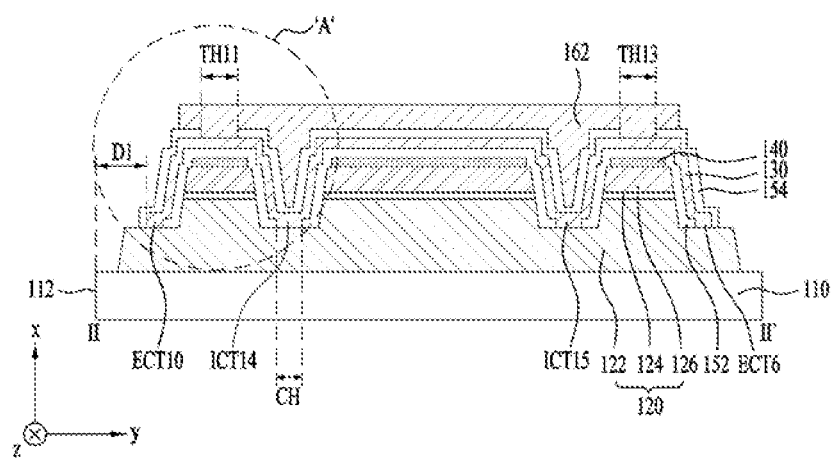
[FIG. 4]
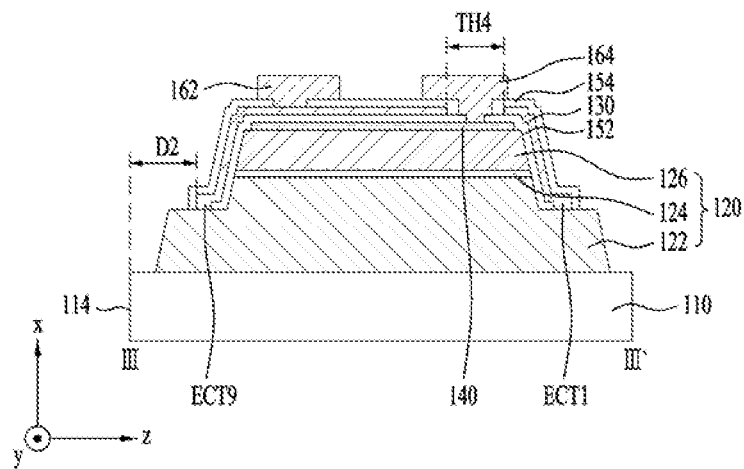

[FIG. 5]
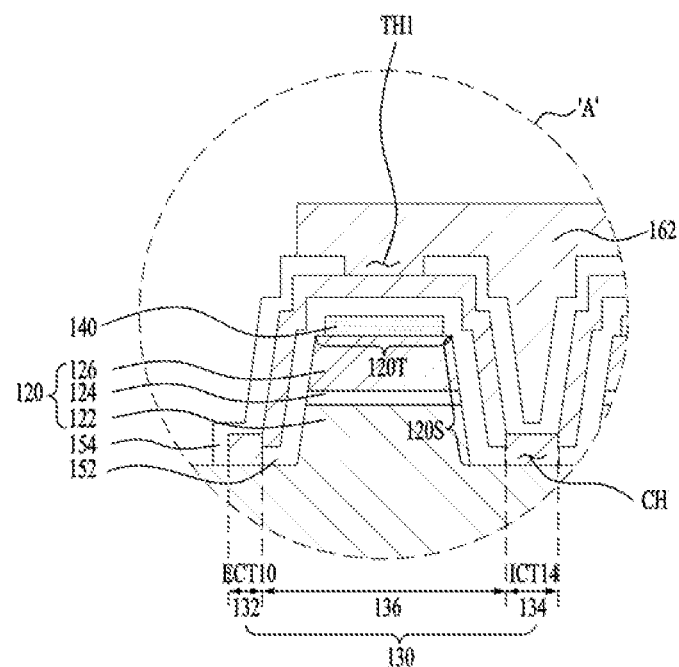
[FIG. 6]
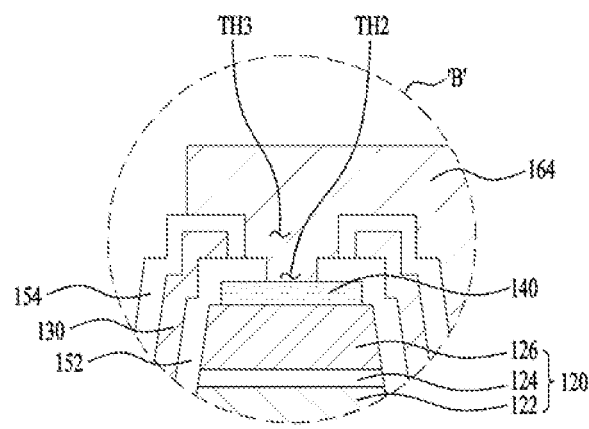

[FIG. 7]
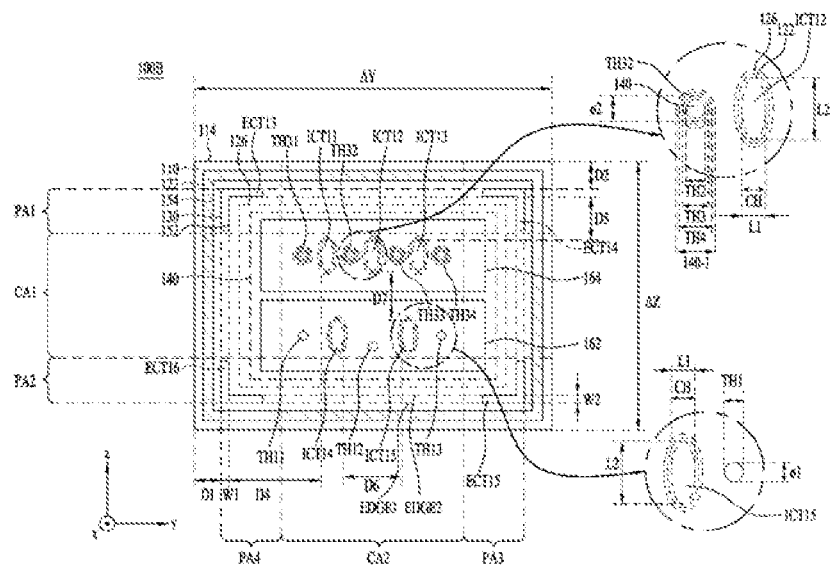
[FIG. 8]
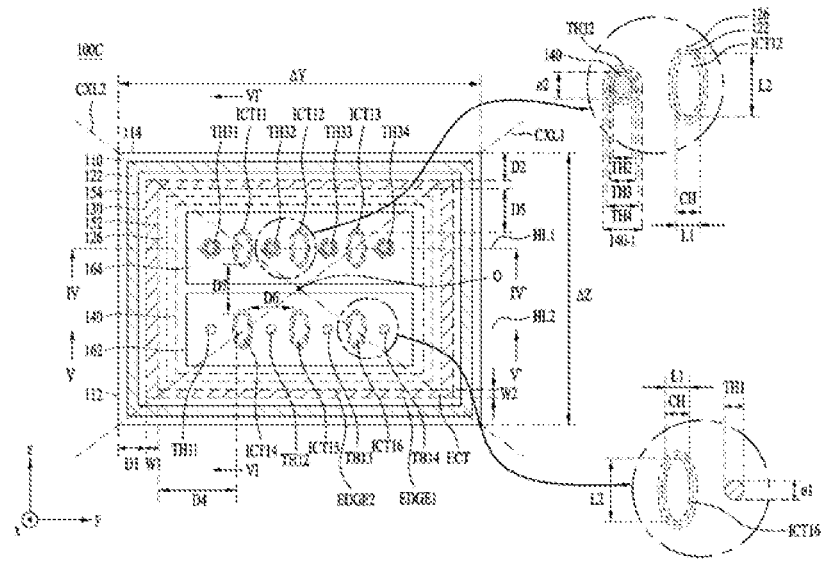

[FIG. 9]
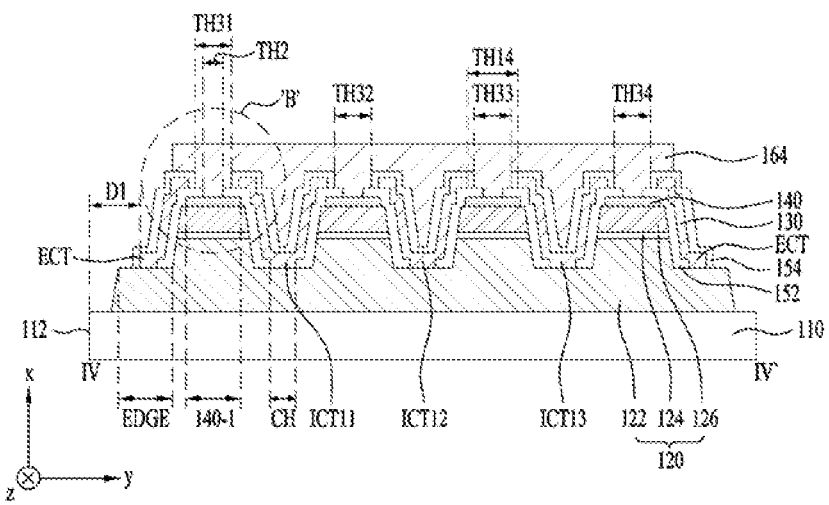
[FIG. 10]
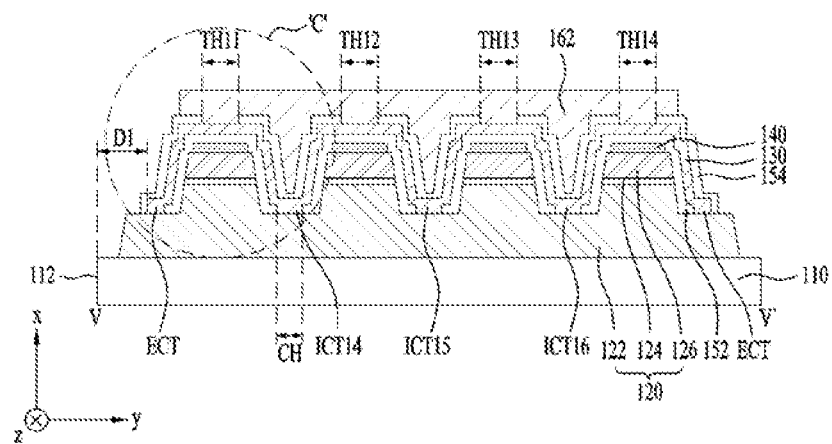

[FIG. 11]
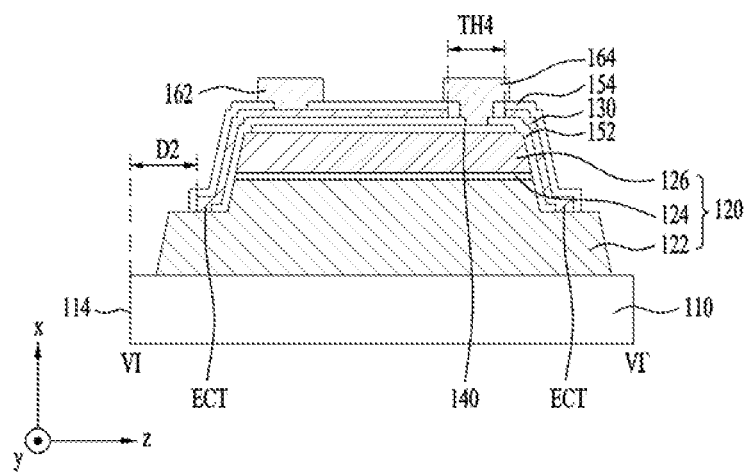
[FIG. 12]
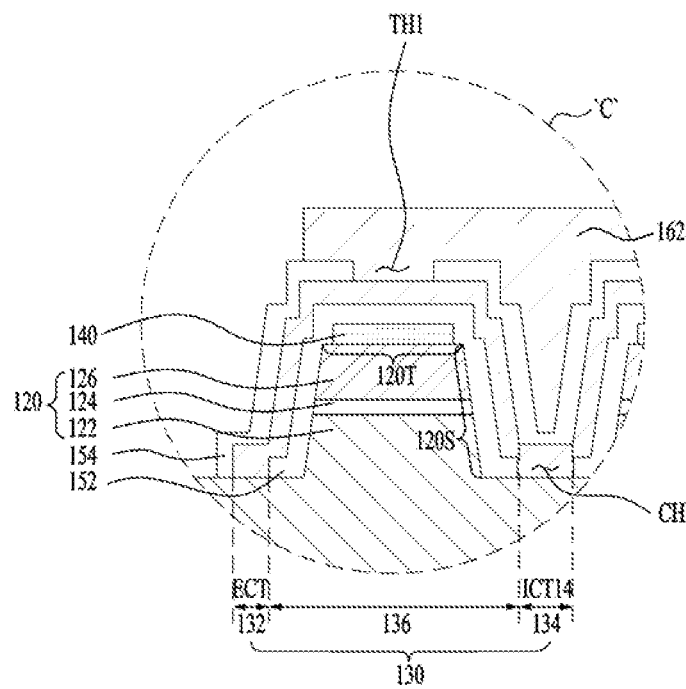

[FIG. 13a]
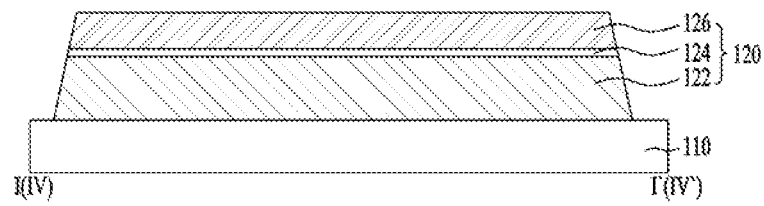
[FIG. 13b]
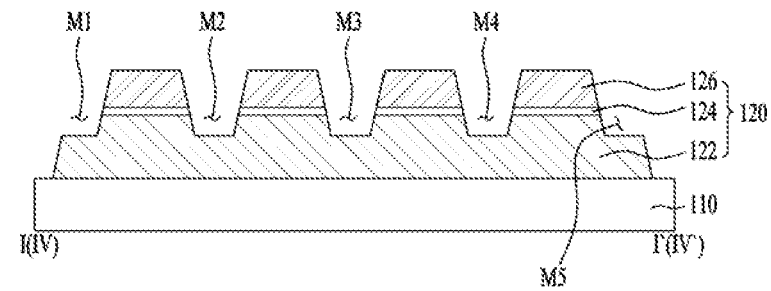
[FIG. 13c]
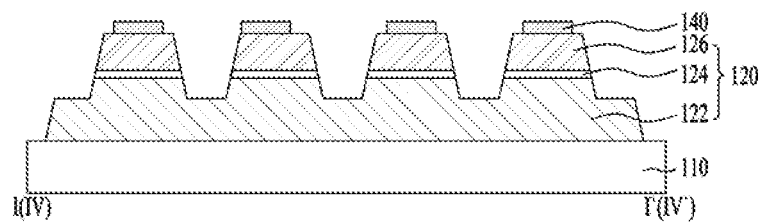
[FIG. 13d]
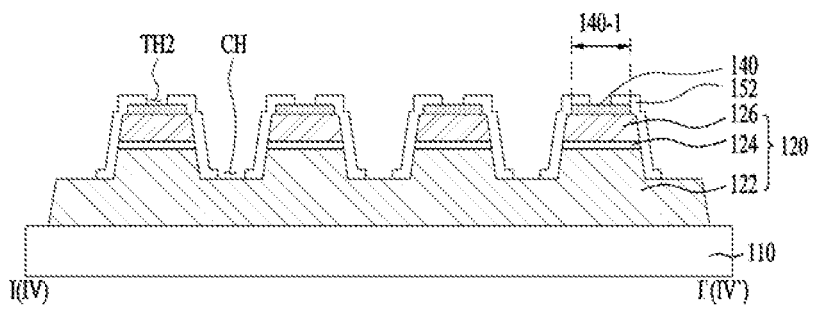

[FIG. 13e]
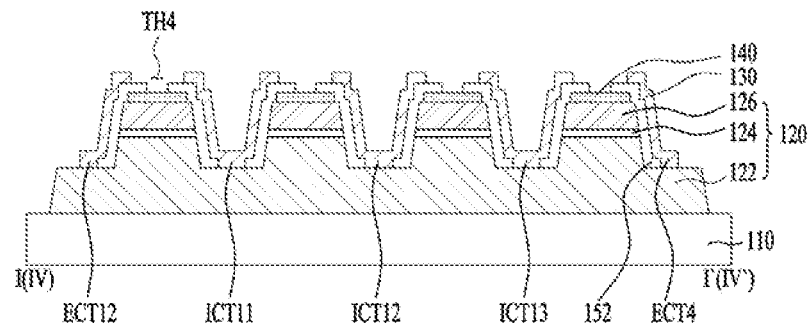
[FIG. 13f]
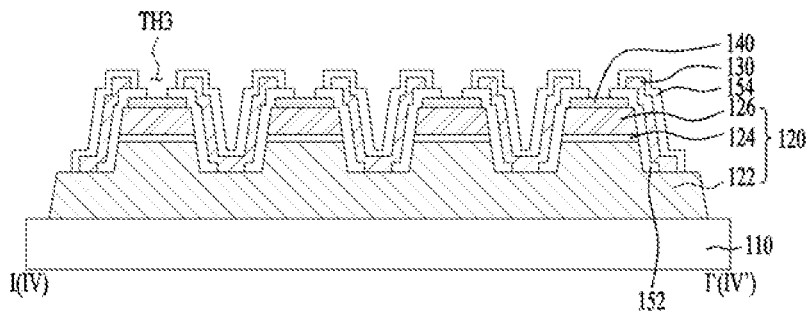
[FIG. 14a]
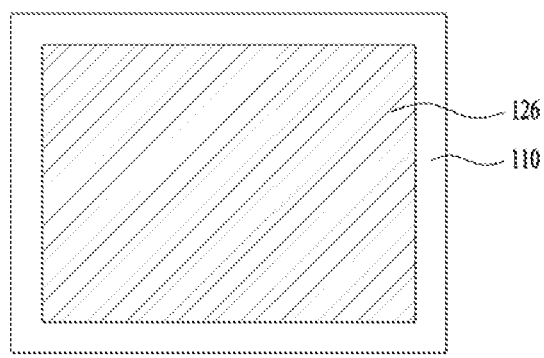

[FIG. 14b]
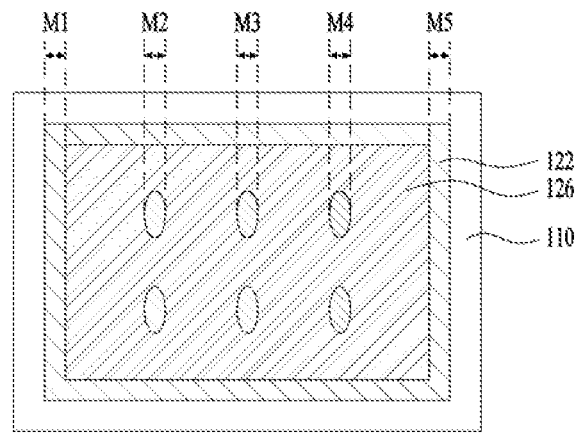
[FIG. 14c]
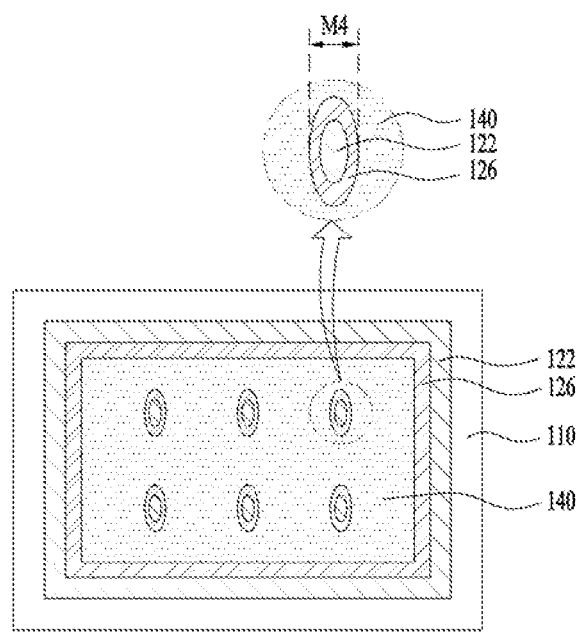

[FIG. 14d]
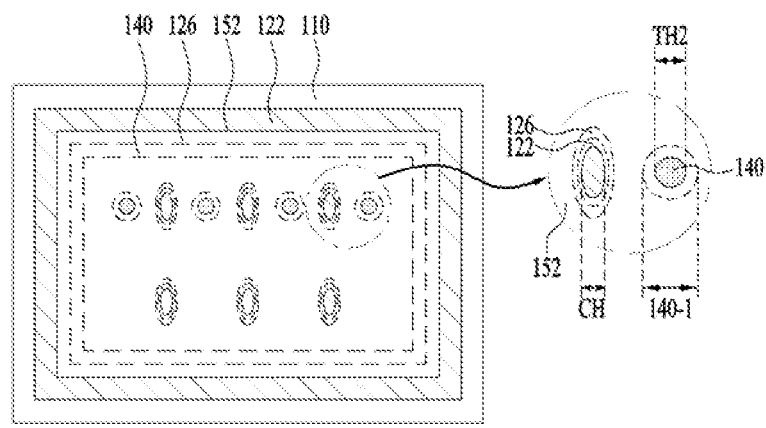
[FIG. 14e]
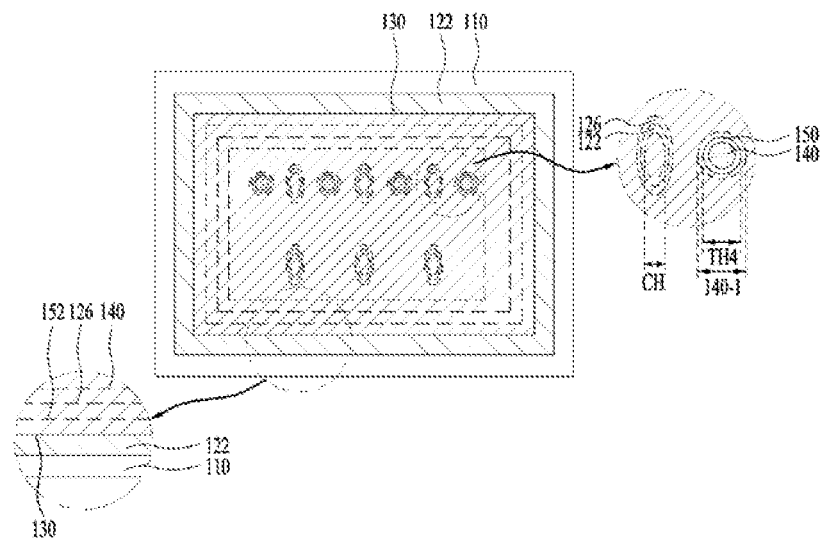

[FIG. 14f]
[FIG. 15]
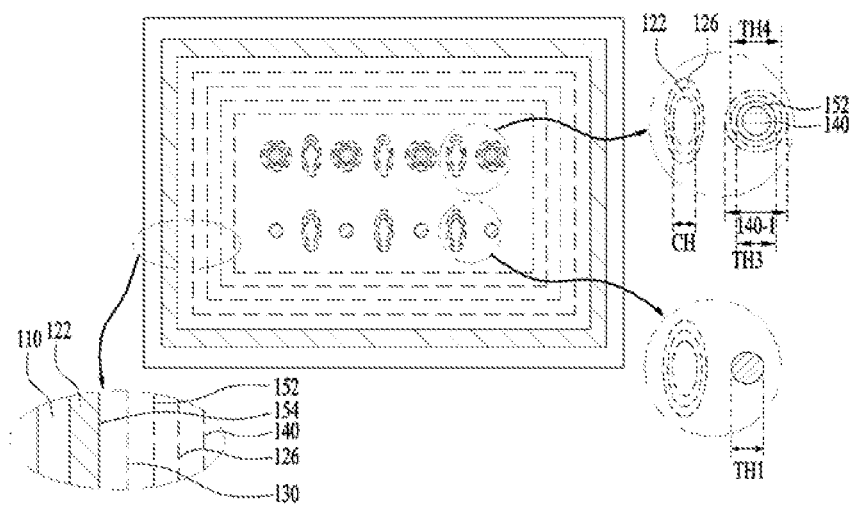

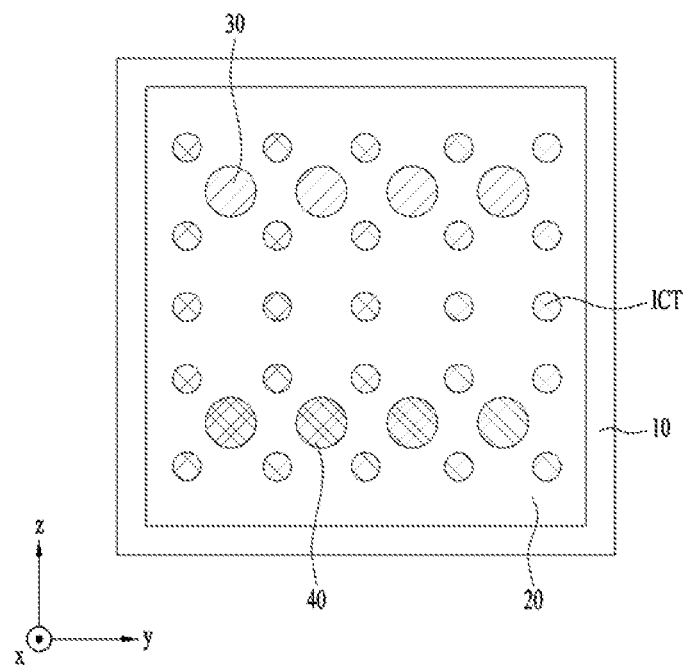
[FIG. 16]

LIGHT-EMITTING ELEMENT, LIGHT-EMITTING ELEMENT PACKAGE COMPRISING LIGHT-EMITTING ELEMENT, AND LIGHT-EMITTING DEVICE COMPRISING LIGHT-EMITTING ELEMENT PACKAGE

CROSS REFERENCE TO RELATED APPLICATIONS

This application is the National Phase of PCT international Application No. PCT/KR2016/009121, filed on Aug. 18, 2016, which claims priority under 35 U.S.C. 119(a) to Patent Application Nos. 10-2015-0115809, filed in the Republic of Korea on Aug. 18, 2015, and 10-2015-0115810, filed in the Republic of Korea on Aug. 18, 2015, all of which are hereby expressly incorporated by reference into the present application.

TECHNICAL FIELD

Embodiments relate to a light-emitting element, a light-emitting element package including the element, and a light-emitting apparatus including the package.

BACKGROUND ART

Light-emitting diodes (LEDs) are one type of semiconductor element that converts electricity into infrared rays or light using the characteristics of a compound semiconductor, in order to transmit or receive signals or to be used as a light source.

Group III-V nitride semiconductors are in the spotlight as a core material for light-emitting elements such as light-emitting diodes (LEDs) or laser diodes (LDs) due to the physical and chemical properties thereof.

Such light-emitting diodes have excellent environmental friendliness because they include no environmentally harmful materials such as mercury (Hg), which has conventionally been used in lighting apparatuses such as incandescent lamps and fluorescent lamps, and also have other advantages, for example, a long lifespan and low power consumption. Therefore, existing light sources are being replaced with light-emitting diodes. There are various studies to improve the light extraction efficiency of existing light-emitting elements including such light-emitting diodes and light-emitting element packages.

Technical Object

Embodiments provide a light-emitting element having increased light extraction efficiency, a light-emitting element package including the element, and a light-emitting apparatus including the package.

Technical Solution

One embodiment provides a light-emitting element including a substrate, a light-emitting structure including a first conductive semiconductor layer, an active layer, and a second conductive semiconductor layer disposed in sequence on the substrate, and first and second electrodes electrically connected to the first and second conductive semiconductor layers, respectively, wherein the first electrode includes at least one first contact part disposed on the first conductive semiconductor layer, which is exposed in at least a portion of a first area of the light-emitting structure, so as to be connected to the first conductive semiconductor layer, and a plurality of second contact parts connected to the first conductive semiconductor layer, which is exposed in a second area located inside the first area of the light-emitting structure in a plane, and wherein the second electrode includes a third contact part disposed in the second area of the light-emitting structure so as to be connected to the second conductive semiconductor layer.

For example, the first electrode may further include a contact connection part configured to interconnect the at least one first contact part and the second contact parts and to interconnect the second contact parts to each other.

For example, the contact connection part may be disposed on a side portion and a top portion of the light-emitting structure, and the light-emitting element may further include a first insulation layer disposed between each of the side portion and the top portion of the light-emitting structure and the contact connection part and disposed between the third contact part and the contact connection part.

For example, the light-emitting element may further include a first bonding pad connected to the first electrode, and a second bonding pad connected to the second electrode and spaced apart from the first bonding pad.

For example, the light-emitting element may further include a second insulation layer disposed between the second bonding pad and the first electrode. The second insulation layer may include a first through-hole configured to expose the first electrode, and the first bonding pad may be connected to the first electrode through the first through-hole. The first through-hole may expose at least one of the first contact part, each second contact part, or the contact connection part, and the first bonding pad may be connected to the exposed contact connection part. The first insulation layer may include a second through-hole configured to expose the third contact part, the second insulation layer may include a third through-hole configured to expose the second through-hole, and the second bonding pad may be connected to the third contact part exposed through the second and third through-holes.

For example, a first planar shape of each of the second contact parts may be different from a second planar shape of the third through-hole. The first planar shape may include an oval shape, and the second planar shape may include a circular shape.

For example, the number of the second contact parts may be greater than the number of the first through-holes and may be greater than the number of the third through-holes.

For example, the second contact parts and the third through-hole may be arranged on the same first horizontal line in a first direction crossing a thickness direction of the light-emitting structure. The second contact parts may be arranged on the first horizontal line in a number smaller than a number of third through-holes. At least some of the second contact parts and the first through-hole may be arranged on the same second horizontal line in the first direction. The second contact parts may be arranged on the second horizontal line in a number smaller than a number of first through-holes. The first horizontal line and the second horizontal line may be parallel to each other. The second contact parts may be arranged on the second horizontal line in a number smaller than or equal to a number of the second contact parts arranged on the first horizontal line.

For example, at least one first or third through-hole may be disposed between the adjacent second contact parts.

For example, at least one second contact part may be disposed between the adjacent first through-holes.

For example, at least one second contact part may be disposed between the adjacent third through-holes.

For example, the second contact parts may have a third planar area less than a second planar area of the first contact part.

For example, the second contact parts may be disposed between the third contact parts when viewed in a cross-sectional shape.

For example, the second contact parts may be arranged in at least one of the first direction, which crosses the thickness direction of the light-emitting structure, or a second direction, which crosses the first direction. The number of the second contact parts arranged in the first direction and the number of the second contact parts arranged in the second direction may be different from each other.

For example, each of the second contact parts may have a first length in the first direction and a second length in the second direction, and the first length and the second length may be different from each other. The first direction and the second direction may cross the thickness direction of the light-emitting structure.

For example, the first contact part may be disposed on the first conductive semiconductor layer, which is exposed in the entire first area of the light-emitting structure, and has a planar shape that surrounds at least one of the first contact part or the third contact part. The second contact parts may be arranged in a planar shape that is symmetrical in the diagonal direction about the center of the light-emitting structure.

Alternatively, the at least one first contact part may include a plurality of first contact parts disposed on the first conductive semiconductor layer, which is exposed in a portion of the entire first area. The first contact parts may be spaced apart from each other by a predetermined distance when viewed in a planar shape. The first contact parts may have the same planar area, or may have different planar areas. The first contact parts may be disposed so as not to overlap the second contact parts in the direction crossing the thickness direction of the light-emitting structure when viewed in a planar shape. A third-first width in the first direction of each of the first contact parts arranged in the first direction and a third-second width in the second direction of each of the first contact parts arranged in the second direction may be the same as or different from each other. The first direction, the second direction, and the thickness direction of the light-emitting structure may cross each other.

For example, the first contact part may be disposed at a distance equal to or greater than a threshold distance from the second contact parts in the entire first area of the light-emitting structure. The threshold distance may be an average value or an intermediate value of a maximum distance and a minimum distance between the first area of the light-emitting structure and the second contact parts.

For example, the planar shape of the first contact part may be different from the planar shape of the second contact part. The planar shape of the first contact part and each of the second contact parts may include at least one of a circular shape, an oval shape, or a polygonal shape.

For example, the planar shape of the first contact part may be the same as the planar shape of the light-emitting element.

For example, a first width of the first area in the first direction and a second width of the first area in the second direction may be the same as or different from each other, and the first direction, the second direction, and the thickness direction of the light-emitting structure may cross each other.

For example, at least one of the first width of the first area in the first direction, the second width of the first area in the second direction, a first length of the second contact part in the first direction, or a second length of the second contact part in the second direction may be determined so that a first conductive carrier is uniformly distributed from the first conductive semiconductor layer to the active layer, and the first direction, the second direction, and the thickness direction of the light-emitting structure may cross each other.

For example, a ratio of the second planar area of the first contact part to a first planar area of the active layer may be within 2%.

A light-emitting element package according to another embodiment includes the light-emitting element and first and second lead frames electrically connected to the first and second electrodes, respectively.

A light-emitting apparatus according to a further embodiment includes the light-emitting element package.

Advantageous Effects

In a light-emitting element and a light-emitting element package according to the embodiments, a first contact part may be disposed in the entire first area of a light-emitting structure to increase the area of a first electrode, or a plurality of first contact parts may be disposed in a portion of the first area to prevent an excessive increase in the area ratio of the first electrode and to reduce the loss of the area of an active layer as well as the loss of the area of a second electrode having a light reflection function, which may result in increased light extraction efficiency.

DESCRIPTION OF DRAWINGS

FIG. 1 illustrates a plan view of a light-emitting element according to one embodiment.

FIG. 2 illustrates a cross-sectional view of the light-emitting element illustrated in FIG. 1 taken along line I-I'.

FIG. 3 illustrates a cross-sectional view of the light-emitting element illustrated in FIG. 1 taken along line II-II'.

FIG. 4 illustrates a cross-sectional view of the light-emitting element illustrated in FIG. 1 taken along line III-III'.

FIG. 5 illustrates an enlarged cross-sectional view of portion "A" illustrated in FIG. 3.

FIG. 6 illustrates an enlarged cross-sectional view of portion "B" illustrated in FIG. 2.

FIG. 7 illustrates a plan view of a light-emitting element according to another embodiment.

FIG. 8 illustrates a plan view of a light-emitting element according to a further embodiment.

FIG. 9 illustrates a cross-sectional view of the light-emitting element illustrated in FIG. 8 taken along line IV-IV'.

FIG. 10 illustrates a cross-sectional view of the light-emitting element illustrated in FIG. 8 taken along line V-V'.

FIG. 11 illustrates a cross-sectional view of the light-emitting element illustrated in FIG. 8 taken along line VI-VI'.

FIG. 12 illustrates an enlarged cross-sectional view of portion "C" illustrated in FIG. 10.

FIGS. 13a to 13f illustrate process cross-sectional views for explaining a method of manufacturing the light-emitting element illustrated in FIG. 2.

FIGS. 14a to 14f illustrate process plan views for explaining a method of manufacturing the light-emitting element illustrated in FIG. 8.

FIG. 15 illustrates a cross-sectional view of a light-emitting element package according to an embodiment.

FIG. 16 illustrates a plan view of a light-emitting element according to a comparative example.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Although light-emitting elements 100A, 100B and 100C and a light-emitting element package 200 according to embodiments will be described using the Cartesian coordinate system, they may of course be described using other coordinate systems. With the Cartesian coordinate system, the x-axis, the y-axis and the z-axis may be orthogonal to one another, but the embodiments are not limited thereto. That is, the x-axis, the y-axis and the z-axis may not be orthogonal to one another, but may cross one another.

Hereinafter, for convenience of description, in each of FIGS. 1, 7, 8, and 14d to 14f, a layer (or portion) hidden by another layer (or portion) is illustrated by a dotted line. However, a plurality of first contact parts ECT1 to ECT16 is illustrated by a solid line in order to assist understanding, although they are hidden.

FIG. 1 illustrates a plan view of a light-emitting element 100A according to one embodiment, FIG. 2 illustrates a cross-sectional view of the light-emitting element 100A illustrated in FIG. 1 taken along line I-I', FIG. 3 illustrates a cross-sectional view of the light-emitting element 100A illustrated in FIG. 1 taken along line FIG. 4 illustrates a cross-sectional view of the light-emitting element 100A illustrated in FIG. 1 taken along line III-III', FIG. 5 illustrates an enlarged cross-sectional view of portion "A" illustrated in FIG. 3, and FIG. 6 illustrates an enlarged cross-sectional view of portion "B" illustrated in FIG. 2.

In FIG. 1, ΔY indicates the width of the light-emitting element 100A in a direction (e.g. the y-axis direction) (hereinafter, referred to as "first direction") crossing the thickness direction of a light-emitting structure 120, and ΔZ indicates the width (or the length) of the light-emitting element 100A in a direction (e.g. the z-axis direction) (hereinafter, referred to as "second direction") crossing each of the thickness direction and the first direction.

Referring to FIGS. 1 to 6, the light-emitting element 100A according to one embodiment may include a substrate 110, the light-emitting structure 120, a first electrode 130, a third contact part 140 corresponding to a second electrode, first and second insulation layers 152 and 154, and first and second bonding pads 162 and 164. Here, the first and second bonding pads 162 and 164 may not be constituent elements of the light-emitting element 100A, but may be constituent elements of a light-emitting element package 200 illustrated in FIG. 15, which will be described later.

The light-emitting structure 120 is disposed on the substrate 110. The substrate 110 may include a conductive material or a non-conductive material. For example, the substrate 110 may include at least one of sapphire $Al_2O_3$, GaN, SiC, ZnO, GaP, InP, $Ga_2O_3$, GaAs, or Si, but the embodiment is not limited as to the material of the substrate 110.

In order to reduce the difference in the coefficient of thermal expansion (CTE) and lattice-mismatching between the substrate 110 and the light-emitting structure 120, a buffer layer (or a transition layer) (not illustrated) may further be disposed between the two 110 and 120. The buffer layer may include at least one material selected from the group consisting of Al, In, N and Ga, for example, without being limited thereto. In addition, the buffer layer may have a single-layer or multilayer structure.

The light-emitting structure 120 may include a first conductive semiconductor layer 122, an active layer 124, and a second conductive semiconductor layer 126. The first conductive semiconductor layer 122, the active layer 124, and the second conductive semiconductor layer 126 may be stacked one above another in sequence from the substrate 110 in the thickness direction (e.g. in the x-axis direction) of the light-emitting structure 120.

The first conductive semiconductor layer 122 is disposed on the substrate 110. The first conductive semiconductor layer 122 may be formed of a compound semiconductor such as a group III-V or II-VI compound semiconductor, which is doped with a first conductive dopant. When the first conductive semiconductor layer 122 is an n-type semiconductor layer, the first conductive dopant may be an n-type dopant, and may include Si, Ge, Sn, Se, or Te, without being limited thereto.

For example, the first conductive semiconductor layer 122 may include a semiconductor material having a composition of $Al_xIn_yGa_{(1-x-y)}N$ ($0 \leq x \leq 1$, $0 \leq y \leq 1$, $0 \leq x+y \leq 1$). The first conductive semiconductor layer 122 may include one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 124 may be disposed between the first conductive semiconductor layer 122 and the second conductive semiconductor layer 126. The active layer 124 is a layer in which electrons (or holes) introduced through the first conductive semiconductor layer 122 and holes (or electrons) introduced through the second conductive semiconductor layer 126 meet each other to emit light having energy that is determined by the inherent energy band of a constituent material of the active layer 124. The active layer 124 may have at least one of a single-well structure, a multi-well structure, a single-quantum well structure, a multi-quantum well (MQW) structure, a quantum wire structure, or a quantum dot structure.

The active layer 124 may include a well layer and a barrier layer having a pair structure of one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may further be formed on and/or under the active layer 124. The conductive clad layer may be formed of a semiconductor having higher band gap energy than the band gap energy of the barrier layer of the active layer 124. For example, the conductive clad layer may include, for example, a GaN, AlGaN, InAlGaN, or super-lattice structure. In addition, the conductive clad layer may be doped to an n-type or a p-type.

According to one embodiment, the active layer 124 may emit light in an ultraviolet wavelength band. Here, the ultraviolet wavelength band means the wavelength band ranging from 100 nm to 400 nm. In particular, the active layer 124 may emit light in a wavelength band ranging from 100 nm to 280 nm. However, the embodiment is not limited as to the wavelength band of the light emitted from the active layer 124.

The second conductive semiconductor layer 126 may be disposed on the active layer 124. The second conductive semiconductor layer 126 may be formed of a semiconductor compound, and may be formed of a compound semiconductor such as a group III-V or II-VI compound semiconductor. For example, the second conductive semiconductor layer 126 may include a semiconductor material having a composition of $In_xAl_yGa_{1-x-y}N$ (0≤x≤1, 0≤y≤1, 0≤x+y≤1). The second conductive semiconductor layer 126 may be doped with a second conductive dopant. When the second conductive semiconductor layer 126 is a p-type semiconductor layer, a second conductive dopant may be a p-type dopant, and may include Mg, Zn, Ca, Sr, Ba, or the like.

The first conductive semiconductor layer 122 may be configured as an n-type semiconductor layer, and the second conductive semiconductor layer 126 may be configured as a p-type semiconductor layer. Alternatively, the first conductive semiconductor layer 122 may be configured as a p-type semiconductor layer, and the second conductive semiconductor layer 126 may be configured as an n-type semiconductor layer.

The light-emitting structure 120 may have any one structure among an n-p junction structure, a p-n junction structure, an n-p-n junction structure, and a p-n-p junction structure.

The first electrode 130 may be electrically connected to the first conductive semiconductor layer 122. To this end, the first electrode 130 may be disposed on the first conductive semiconductor layer 122, which is exposed in at least a portion of a first area (or an edge area) of the light-emitting structure 120. Here, the first area may be located on the edge of the light-emitting structure 120 in a plane. According to one embodiment, as illustrated in FIGS. 1 to 7, the first electrode 130 may include a plurality of first contact parts (or edge contact parts (ECTs)). According to another embodiment, as illustrated in FIGS. 8 to 12, the first electrode 130 may include a single first contact part. This will be described below in detail.

According to one embodiment, the first electrode 130 may include a plurality of first contact parts (edge contact parts (ECTs)) ECT1 to ECT12 and a plurality of second contact parts (internal contact parts (ICTs)) ICT11 to ICT15.

The respective first contact parts ECT1 to ECT12 and the respective second contact parts ICT11 to ICT15 may be electrically connected to the first conductive semiconductor layer 122, which is exposed by mesa etching.

The respective first contact parts ECT1 to ECT12 may be disposed on the first conductive semiconductor layer 122, which is exposed by mesa-etching the second conductive semiconductor layer 126, the active layer 124, and a portion of the first conductive semiconductor layer 122, in the entirety EDGET of the first area EDGE of the light-emitting structure 120, and may be electrically connected to the first conductive semiconductor layer 122. Here, the entirety EDGET of the first area may be the entire area between a first boundary EDGE1 and a second boundary EDGE2, illustrated by the dotted line in FIG. 1, and may be the outermost area EDGE of the light-emitting structure 120.

That is, the first contact parts ECT1 to ECT12 may be disposed only on a portion of the entire first area of the light-emitting structure 120. Thus, the entire first area of the light-emitting structure 120 includes a portion that is not mesa-etched.

Based on the plan view of FIG. 1, the respective first contact parts ECT10 to ECT12, disposed on the left side in the first direction, and the respective first contact parts ECT4 to ECT6, disposed on the right side in the first direction may be spaced apart from a first edge 112 of the substrate 110 by a first distance D1 in the first direction. In addition, the respective first contact parts ECT1 to ECT3, disposed on the upper side in the second direction, and the respective first contact parts ECT7 to ECT9, disposed on the lower side in the second direction, may be spaced apart from a second edge 114 of the substrate 110 by a second distance D2 in the second direction. Each of the first and second distances D1 and D2 may be changed depending on a process margin. That is, each of the first and second distances D1 and D2 may be set to the minimum within a range allowed by a process margin.

The first contact parts ECT1 to ECT12 may be spaced apart from each other by a constant distance equal to a third distance D3, but the embodiment is not limited thereto. That is, according to another embodiment, the first contact parts ECT1 to ECT12 may be spaced apart from each other by different distances. For example, the distance between a first-first contact part ECT1 and a first-second contact part ECT2 may be different from the distance between the first-second contact part ECT2 and a first-third contact part ECT3.

In addition, the respective first contact parts ECT1 to ECT12 may have different planar areas, as illustrated in FIG. 1, or may have the same planar area, unlike the illustration of FIG. 1.

According to one embodiment, in the entire first area EDGET of the light-emitting structure 120, the first contact parts ECT1 to ECT12 may be disposed only at positions at which spacing distances SD: D4 and D5 from the second contact parts ICT11 to ICT15 are equal to or greater than a threshold distance. Here, the threshold distance may be represented by the following Equation 1.

$$DTH = \frac{Dmax + Dmin}{2} \qquad \text{Equation 1}$$

Here, DTH is the threshold distance, Dmax is the maximum distance between the first area EDGE of the light-emitting structure 120 and the second contact part, and Dmin is the minimum distance between the first area EDGE of the light-emitting structure 120 and the second contact part.

When the second contact parts ICT11 to ICT15 are disposed in a second area in the planar shape illustrated in FIG. 1, the maximum distance Dmax may correspond to the corner of the first area EDGET, and the minimum distance Dmin may correspond to the side of the first area EDGET. Here, the second area may be the area located inside the first area of the light-emitting structure 120 in a plane.

Considering the above-described Equation 1, the threshold distance DTH is the average value of the maximum distance Dmax and the minimum distance Dmin, but the embodiment is not limited thereto. That is, according to another embodiment, the threshold distance DTH may be the intermediate value of the maximum distance Dmax and the minimum distance Dmin.

The reason that the first contact parts ECT1 to ECT12 are disposed only on the edge, which is spaced apart from the second contact parts ICT11 to ICT15 by a distance equal to or greater than the threshold distance DTH, is to allow the first contact parts ECT1 to ECT12 to be disposed as far as possible from the second contact parts ICT11 to ICT15, which may cause a carrier introduced through the first electrode 130 to be uniformly distributed to the active layer 124 so as to enable uniform light emission.

According to another embodiment, the first contact parts ECT1 to ECT12 may be disposed in the entire first area EDGET of the light-emitting structure 120 only at positions at which the spacing distances SD: D4 and D5 from the second contact parts ICT11 to ICT15 are equal to or less than a current spreading length. The reason for this is as follows.

The spacing distance SD may be the current spreading length, and the value thereof may be changed depending on the current used in the light-emitting element 100A and the EPI characteristics of a wafer. For example, when the EPI characteristics are aimed at current spreading and current spreading is excellent, the spacing distance SD may be increased. In addition, in terms of usage current, since current spreading is excellent when working current is low, the spacing distance SD may be increased. When the spacing distance SD is greater than the current spreading length, the electrical characteristics of the light-emitting element 100A may be deteriorated because the first electrode is located farther than the current spreading length. Therefore, the spacing distance SD may be equal to or less than the current spreading length, but the embodiment is not limited thereto.

FIG. 7 illustrates a plan view of a light-emitting element 100B according to another embodiment.

The light-emitting element 100B illustrated in FIG. 7 is substantially the same as the light-emitting element 100A illustrated in FIG. 1, excluding differences in the arrangement position, number, and shape of the first contact parts ECT13 to ECT16, and thus a repeated description will be omitted, and only differences therebetween will be described below. That is, in the light-emitting element 100B illustrated in FIG. 7, a description of parts that are the same as those in the light-emitting element 100A illustrated in FIGS. 1 to 6 will be replaced with a description related to the light-emitting element 100A.

The light-emitting element 100A illustrated in FIG. 1 includes twelve first contact parts ECT1 to ECT12 and the light-emitting element 100B illustrated in FIG. 7 includes four first contact parts ECT13 to ECT16, but the embodiments are not limited thereto.

In addition, the first contact parts ECT1 to ECT12 illustrated in FIG. 1 are disposed only on the sides of the first area EDGET of the light-emitting structure 120, whereas the first contact parts ECT13 to ECT16 illustrated in FIG. 7 are disposed only on the corners of the first area EDGET of the light-emitting structure 120. This will be described below in detail.

Based on the plane illustrated in FIG. 7, the light-emitting structure 120 may include first to fourth peripheral areas PA1 to PA4 and first and second central areas CA1 and CA2.

The peripheral areas PA1 to PA4 of the light-emitting structure 120 are defined as areas in which the first contact parts ECT13 to ECT16 are disposed, and are shaped to surround the central areas CA1 and CA2. The corners of the light-emitting structure 120 may include an area that falls entirely in the first and third peripheral areas PA1 and PA3, an area that falls entirely in the first and fourth peripheral areas PA1 and PA4, an area that falls entirely in the second and third peripheral areas, and an area that falls entirely in the second and fourth peripheral areas PA2 and PA4.

When the distances between the corners of the light-emitting structure 120 and the second contact parts ICT11 to ICT15 are equal to or greater than the threshold distance DTH described above in Equation 1, as illustrated in FIG. 7, the first contact parts ECT13 to ECT16 may be disposed only on the corner areas.

The central areas CA1 and CA2 are defined as areas in which the second contact parts ICT11 to ICT15 are disposed, and are surrounded by the peripheral areas PA1 to PA4.

The first contact parts ECT1 to ECT12 illustrated in FIG. 1 are disposed so as to overlap the second contact parts ICT11 to ICT15 in the first and second directions. However, the embodiment is not limited thereto. That is, according to another embodiment, at least one of the first contact parts may be disposed so as not to overlap the second contact parts in at least one of the first direction or the second direction. For example, as illustrated in FIG. 7, the first contact parts ECT13 to ECT16 may be disposed so as not to overlap the second contact parts ICT11 to ICT15 in the first direction and in the second direction. Due to this, the area occupied by the first contact parts ECT13 to ECT16 in the overall planar area of the light-emitting element 100B may be minimized. When the planar area occupied by the first contact parts ECT13 to ECT16 is increased, the light extraction efficiency of the light-emitting elements 100A and 100B may not be increased. This may be caused when the overall size of the light-emitting elements 100A and 100B is as small as about 1000 μm×1000 μm ($\Delta Y \times \Delta Z$), compared to the case in which the overall size is as large as 1400 μm×1400 μm ($\Delta Y \times \Delta Z$). This is because the first contact parts ECT1 to ECT16 do not have good reflection characteristics.

In addition, each of the second contact parts ICT11 to ICT15 may be disposed on the first conductive semiconductor layer 122, which is exposed through a contact hole CH formed by mesa-etching the second conductive semiconductor layer 126, the active layer 124, and a portion of the first conductive semiconductor layer 122, and may be electrically connected to the exposed first conductive semiconductor layer 122. As described above, when the area located inside the first area of the light-emitting structure 120 when viewed in a plane is defined as the second area, each of the second contact parts ICT11 to ICT15 may be disposed on the first conductive semiconductor layer 122, which is exposed through the contact hole CH, in the second area, thereby being electrically connected to the exposed first conductive semiconductor layer 122.

Hereinafter, the detailed structure of the above-described first electrode 130 will be described with reference to FIG. 5. FIG. 5 corresponds to the detailed structure of the first electrode 130 in the light-emitting element 100A illustrated in FIG. 1, but the detailed structure of the first electrode 130 in the light-emitting element 100B illustrated in FIG. 7 is the same as that of FIG. 5.

As illustrated in FIG. 5, the first electrode 130 may include a first contact part 132 (e.g. ECT10) and a second contact part 134 (e.g. ICT14). In addition, the first electrode 130 may further include a contact connection part 136.

The first contact part 132 (e.g. ECT10) is connected to the first conductive semiconductor layer 122, which is exposed by mesa etching, in the first area EDGE. The second contact part 134 (e.g. ICT14) may be shaped so as to be connected to the first conductive semiconductor layer 122, which is exposed through the contact hole CH formed by mesa etching, in the second area inside the first area EDGE.

As in the form illustrated in FIG. 5, the contact connection part 136 serves to electrically interconnect each of the first contact parts 132 (e.g., ECT1 to ECT12 or ECT13 to ECT16) and the second contact part 134 (e.g., ICT11, ICT13, ICT14 or ICT15), and also serves to electrically interconnect the second contact parts ICT11 to ICT15 to each other.

In addition, the contact connection part 136 may be disposed on each of the side portion and the top portion of the light-emitting structure 120 so as to connect the first contact parts (e.g., ECT1 to ECT12 or ECT13 to ECT16) to the second contact parts (e.g., ICT11, ICT13, ICT14 and ICT15).

In addition, as illustrated in FIG. 5, in the first electrode 130, the first contact parts 132 (e.g., ECT1 to ECT12 or ECT13 to ECT16), the second contact part 134 (e.g., ICT11, ICT13, ICT14 and ICT15), and the contact connection part 136 may be integrally formed with each other, but the embodiment is not limited thereto.

In addition, in the first electrode 130, each of the first contact parts 132 (e.g., ECT1 to ECT16) and the second contact parts 134 (e.g., ICT11 to ICT15) may include an ohmic-contact material, and a separate ohmic layer may be disposed on or under each of the first contact parts 132 (e.g., ECT1 to ECT16) and the second contact parts 134 (e.g., ICT11 to ICT15).

The second electrode may be disposed on the second conductive semiconductor layer 126, and may be electrically connected to the second conductive semiconductor layer 126.

According to the embodiment, the second electrode may include the third contact part 140. The third contact part 140 may be disposed in the second area located inside the first area EDGE of the light-emitting structure 120 in a plane, and may be electrically connected to the second conductive semiconductor layer 126.

The third contact part 140 may include at least one of a transparent electrode (not illustrated) or a light-reflecting layer (not illustrated).

The light-reflecting layer may be formed of a reflective material such as silver (Ag). The transparent electrode may be disposed between the light-reflecting layer and the second conductive semiconductor layer 126, and the light-reflecting layer may be disposed on the transparent electrode.

The transparent electrode may be a transparent conductive oxide (TCO) layer. For example, the transparent electrode may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials.

In addition, the third contact part 140 may have ohmic characteristics, and may include a material for ohmic-contact with the second conductive semiconductor layer 126. When the third contact part 140 performs an ohmic function, a separate ohmic layer (not illustrated) may not be formed.

As described above, when the third contact part 140 includes the light-reflecting layer, in a flip-chip-bonding-type light-emitting element 100, the light, discharged from the active layer 124 and directed to the second conductive semiconductor layer 126, may be reflected by the third contact part 140 to thereby be guided to the substrate 110, which may increase light extraction efficiency.

Since the light-emitting element 100A illustrated in FIGS. 1 to 6 may be applied to the light-emitting element package 200 having a flip-chip-bonding structure as will be described below with reference to FIG. 15, the light from the active layer 124 may be discharged through the first electrode 130, the first conductive semiconductor layer 122, and the substrate 110. To this end, the first electrode 130, the first conductive semiconductor layer 122, and the substrate 110 may be formed of a light-transmitting material. At this time, the second conductive semiconductor layer 126 and the third contact part 140 may be formed of a light-transmitting or non-transmitting material or a reflective material, but the embodiment is not limited to a particular material. That is, each of the first contact parts 132 (e.g., ECT1 to ECT12), the second contact parts 134 (e.g., ICT11 to ICT15), the contact connection part 136, and the third contact part 140 may be formed of any material that may reflect or transmit the light discharged from the active layer 124, rather than absorbing the light, and that may be grown to a high quality on the first and second conductive semiconductor layers 122 and 126. For example, each of the first contact parts 132 (e.g., ECT1 to ECT12), the second contact parts 134 (e.g., ICT11 to ICT15), the contact connection part 136, and the third contact part 140 may be formed of a metal, and may be formed of Ag, Ni, Al, Rh, Pd, Ir, Ru, Mg, Zn, Pt, Au, Hf, or a selective combination thereof.

In addition, the plurality of second contact parts may be arranged in at least one of the y-axis direction, which is the first direction, or the z-axis direction, which is the second direction. For example, referring to FIG. 1, the second contact parts ICT11 to ICT13 may be arranged in the y-axis direction, which is the first direction, and the second contact parts ICT14 and ICT15 may also be arranged in the y-axis direction, which is the first direction. However, the embodiment is not limited thereto, and the second contact parts may be arranged in at least one of the first direction or the second direction in various forms.

Hereinafter, the length of the second contact parts ICT11 to ICT15 in the y-axis direction, which is the first direction, is referred to as "first length L1", and the length thereof in the z-axis direction, which is the second direction, is referred to as "second length L2".

In addition, in each of the second contact parts ICT11 to ICT15, the first length L1 and the second length L2 may be the same as or different from each other. The planar shape of each of the second contact parts ICT11 to ICT15, i.e. the planar shape of the contact hole CH, may be a circular shape in which the first length L1 and the second length L2 are the same, or may be an oval shape in which the first length L1 is greater than the second length L2 or in which the second length L2 is greater than the first length L1.

When the contact hole CH has a small area, the working voltage may increase. Therefore, in order to compensate for an increase in working voltage, according to one embodiment, each of the second contact parts ICT11 to ICT15 may have a single contact hole CH, as illustrated in FIG. 1, and the second length L2 may be greater than the first length L1.

Alternatively, in order to compensate for an increase in working voltage, unlike the illustration of FIG. 1, the first length L1 may be greater than the second length L2.

Alternatively, each of the second contact parts ICT11 to ICT15 may have a plurality of contact holes CH, unlike the illustration of FIG. 1.

In addition, the respective second contact parts ICT11 to ICT15 may have the same first length L1 or different first lengths in the first direction. For example, referring to FIG. 1, the respective second contact parts ICT11 to ICT15 may have the same first length L1.

In addition, the respective second contact parts ICT11 to ICT15 may have the same second length L2 or different second lengths L2 in the second direction. For example, referring to FIG. 1, the respective second contact parts ICT11 to ICT15 may have the same second length L2.

In addition, in the edge area EDGE, the first width W1 thereof in the y-axis direction, which is the first direction, and the second width W2 thereof in the z-axis direction, which is the second direction, may be the same as or different from each other.

In addition, the third-first width W3Y in the first direction of each of the first contact parts ECT1, ECT2, ECT3, ECT7, ECT8 and ECT9, which are arranged in the first direction, may be the same as or different from the third-second width W3Z in the second direction of each of the first contact parts ECT4, ECT5, ECT6, ECT10, ECT11 and ECT12, which are arranged in the second direction. Each of the third-first width W3Y and the third-second width W3Z may be greater than 1 μm, and for example, may be 5 μm, but the embodiment is not limited thereto.

In addition, the minimum distance between the first contact parts ECT1 to ECT16 and the second contact parts ICT11 to ICT15 in the first direction (e.g. the y-axis direction) is referred to as "fourth distance D4", the minimum distance between the first contact parts ECT1 to ECT16 and the second contact parts ICT11 to ICT15 in the second direction (e.g. the z-axis direction) is referred to as "fifth distance D5", the distance between the respective second contact parts ICT11 to ICT15 in the first direction is referred to as "sixth distance D6", and the distance between the respective second contact parts ICT11 to ICT15 in the second direction is referred to as "seventh distance D7".

In addition, at least one of the distance Dmin, the distance Dmax, the first to seventh distances D7, the first width W1, the second width W2, the third-first width W3Y, the third-second width W3Z, the first length L1, or the second length L2 may be determined to allow a first conductive carrier to be uniformly supplied from the first conductive semiconductor layer 122 to the active layer 124 throughout the plane of the light-emitting elements 100A and 100B.

In addition, at least one of the first width W1, the second width W2, the third-first width W3Y, the third-second width W3Z, the first length L1, or the second length L2 may be determined depending on the first to seventh distances D1 to D7.

For example, the seventh distance D7 may be determined depending on the current spreading length and the distance between the first and second bonding pads 162 and 164.

In addition, the respective second contact parts ICT11 to ICT15 may have the same first planar shape, as illustrated in FIG. 1 or FIG. 7, but the embodiments are not limited thereto. That is, according to another embodiment, the respective second contact parts ICT11 to ICT15 may have different first planar shapes, unlike the illustration of FIG. 1 or FIG. 7.

In addition, the respective first contact parts ECT1 to ECT6 may have a second planar shape, which is the same as or different from the first planar shape.

Each of the first and second planar shapes may include at least one of a circular shape, an oval shape, or a polygonal shape, but the embodiment is not limited thereto. For example, as illustrated in FIG. 1, the second planar shape of the respective first contact parts ECT1 to ECT12 may be a rectangular shape, and the first planar shape of the respective second contact parts ICT11 to ICT15 may be a circular shape, but the embodiment is not limited thereto.

In addition, the second planar shape of at least one of the first contact parts ECT1 to ECT16 may be the same as or different from the planar shape of the light-emitting elements 100A and 100B. For example, the planar shape of the light-emitting element 100A illustrated in FIG. 1 may be a rectangular shape, and the second planar shape of the respective first contact parts ECT1 to ECT12 may be a rectangular shape, in the same manner as the planar shape of the light-emitting element 100A.

Meanwhile, referring to FIG. 5, the first insulation layer 152 is disposed between a side portion 120S of the light-emitting structure 120 and the contact connection part 136 to electrically insulate the two 120S and 136 from each other, is disposed between a top portion 120T of the light-emitting structure 120 and the contact connection part 136 to electrically insulate the two 120T and 136 from each other, and is disposed between the third contact part 140 disposed on the top portion 120T of the light-emitting structure 120 and the contact connection part 136 to electrically insulate the two 140 and 136 from each other.

The first insulation layer 152 may include the contact hole CH, which exposes the first conductive semiconductor layer 122 via mesa etching, in the second area, which is located inside the first area EDGE of the light-emitting structure 120 in a plane, and the second contact parts ICT11 to ICT15 may be electrically connected to the first conductive semiconductor layer 122 through the contact hole CH in the first insulation layer 152.

Meanwhile, the first bonding pad 162 is electrically connected to the first electrode 130. The second bonding pad 164 is electrically connected to the third contact part 140, which is the second electrode, and is electrically separated from the first bonding pad 162. To this end, the first and second bonding pads 162 and 164 may be disposed in various forms on the top portion of the light-emitting element 100A illustrated in FIG. 1, and the embodiment is not limited to a particular shape of the first and second bonding pads 162 and 164.

Each of the first and second bonding pads 162 and 164 may have a polygonal planar shape, a circular planar shape, or an oval planar shape. For example, as illustrated in FIG. 1, each of the first and second bonding pads 162 and 164 may have a rectangular planar shape.

Referring to FIG. 6, the second insulation layer 154 is disposed between the second bonding pad 164 and the first electrode 130 to electrically separate the two 130 and 164 from each other.

For example, each of the first and second insulation layers 152 and 154 may include at least one of $SiO_2$, $TiO_2$, $ZrO_2$, $Si_3N_4$, $Al_2O_3$, or $MgF_2$, but the embodiment is not limited to a particular material of each of the first and second insulation layers 152 and 154. For example, each of the first and second insulation layers 152 and 154 may be configured as a distributed Bragg reflector (DBR).

Referring to FIG. 5, the second insulation layer 154 may include a first through-hole TH1, which exposes the first electrode 130. Here, referring to FIGS. 1 and 3, the first through-hole TH1 may include first-first to first-third through-holes TH11 to TH13.

Here, it can be seen that the first-second through-hole TH12 is located lower in the −z-axis direction than the first-first and first-third through-holes TH11 and TH13, which are disposed closer to the first area EDGE of the light-emitting structure 120 than the first-second through-hole TH12. This serves to more uniformly supply a first conductive carrier to the active layer 124 since the number of second contact parts ICT14 and ICT15, which are disposed under the first bonding pad 162 in the thickness direction of the light-emitting structure 120, is less than the number of second contact parts ICT11 to ICT13, which are disposed under the second bonding pad 164 in the thickness direction of the light-emitting structure 120.

In addition, the respective first-first to first-third through-holes TH11, TH12 and TH13 may have the same planar shape, as illustrated in FIG. 1, or may have different planar shapes, unlike the illustration of FIG. 1.

The planar shape of each of the first-first to first-third through-holes TH11, TH12 and TH13 may be a circular shape, an oval shape, or a polygonal shape. For example, as illustrated in FIG. 1, the planar shape of each of the first-first to first-third through-holes TH11, TH12 and TH13 may be a circular shape.

In addition, when the planar shape of each of the first through-holes TH1:TH11, TH12 and TH13 is a circular shape, the first diameter φ1 of the first through-holes TH1 may be the same as or different from the first or second length L1 or L2. For example, as illustrated in FIG. 1, the first diameter φ1 may be less than the second length L2.

The first bonding pad 162 may be electrically connected to the first electrode 130, which is exposed through the first through-holes TH1. As described above with reference to FIG. 5, the first electrode 130 includes the first contact parts 132, the second contact part 134, and the contact connection part 136. The first through-hole TH1 may expose at least one of the first contact part 132, the second contact part 134, or the contact connection part 136.

For example, as illustrated in FIGS. 3 and 5, the first through-hole TH1 may expose the contact connection part 136 of the first electrode 130. Thus, the first bonding pad 162 may be electrically connected to the contact connection part 136, which is exposed through the first through-hole TH1. In this case, the first through-hole TH1, the contact connection part 136, and the third contact part 140 may overlap each other in the thickness direction of the light-emitting structure 120.

Referring to FIGS. 2 and 6, the first insulation layer 152 may include a second through-hole TH2, which exposes the third contact part 140. In addition, the second insulation layer 154 may include a third through-hole TH3, which exposes the second through-hole TH2. Here, referring to FIGS. 1 and 2, the third through-hole TH3 may include third-first to third-fourth through-holes TH31 to TH34. Thus, the second bonding pad 164 may be electrically connected to the third contact part 140, which is exposed through the second and third through-holes TH2 and TH3.

In addition, the respective third through-holes TH3:TH31, TH32, TH33 and TH34 may have the same planar shape, as illustrated in FIG. 1, or may have different planar shapes, unlike the illustration of FIG. 1.

In addition, the planar shape of each of the third through-holes TH31, TH32, TH33 and TH34 may be a circular shape, an oval shape, or a polygonal shape. For example, as illustrated in FIG. 1, the planar shape of each of the third through-holes TH31, TH32, TH33 and TH34 may be a circular shape.

In addition, when the planar shape of each of the third through-holes TH31, TH32, TH33 and TH34 is a circular shape, the second diameter φ2 of the third through-holes TH3 may be the same as or different from the first or second length L1 or L2. For example, as illustrated in FIG. 1, the second diameter φ2 may be less than the second length L2.

In addition, referring to FIGS. 1 to 3, each of the second contact parts ICT11 to ICT15 may be disposed between third contact parts 140 when viewed in a cross-sectional shape.

For example, referring to FIGS. 1 and 2, the second-first contact part ICT11 may be disposed between the third contact parts 140, which are exposed respectively through the third-first through-hole TH31 and the third-second through-hole TH32, when viewed in a cross-sectional shape, the second-second contact part ICT12 may disposed between the third contact parts 140, which are exposed respectively through the third-second through-hole TH32 and the third-third through-hole TH33, when viewed in a cross-sectional shape, and the second-third contact part ICT13 may be disposed between the third contact parts 140, which are exposed respectively through the third-third through-hole TH33 and the third-fourth through-hole TH34, when viewed in a cross-sectional shape.

In addition, at least one second contact part may be disposed between a plurality of adjacent third through-holes.

According to one embodiment, as illustrated in FIGS. 1 and 2, a single second-first contact part ICT11 may be disposed between the third-first and third-second through-holes TH31 and TH32, which are adjacent to each other in the first direction, a single second-second contact part ICT12 may be disposed between the third-second and third-third through-holes TH32 and TH33, which are adjacent to each other in the first direction, and a single second-third contact part ICT13 may be disposed between the third-third and third-fourth through-holes TH33 and TH34, which are adjacent to each other in the first direction.

According to another embodiment, a plurality of second contact parts may be disposed between a plurality of adjacent third through-holes TH3: TH31 to TH34. That is, although not illustrated, for example, a plurality of second-first contact parts ICT11 may be disposed between the third-first through-hole TH31 and the third-second through-hole TH32.

In addition, at least one third through-hole may be disposed between the adjacent second contact parts.

According to one embodiment, as illustrated in FIGS. 1 and 2, a single third through-hole TH3 may be disposed between a plurality of second contact parts, which are adjacent to each other in the first direction. That is, a single third-second through-hole TH32 may be disposed between the second-first and second-second contact parts ICT11 and ICT12, which are adjacent to each other, and a single third-third through-hole TH33 may be disposed between the second-second and second-third contact parts ICT12 and ICT13, which are adjacent to each other.

According to another embodiment, a plurality of third through-holes TH3 may be disposed between a plurality of second contact parts, which are adjacent to each other in the first direction. For example, although not illustrated, a plurality of third-second through-holes TH32 may be disposed between the second-first contact part ICT11 and the second-second contact part ICT12.

In addition, referring to FIGS. 1 and 3 together, the second-fourth contact part ICT14 may be disposed between the third contact parts 140, which are located respectively under the first-first through-hole TH11 and the first-second through-hole TH12, when viewed in a cross-sectional shape, and the second-fifth contact part ICT15 may be disposed between the third contact parts 140, which are located respectively under the first-second through-hole TH12 and the first-third through-hole TH13, when viewed in a cross-sectional shape.

In addition, at least one second contact part may be disposed between the first through-holes TH1:TH11 to TH13, which are adjacent to each other in the first direction.

According to one embodiment, as illustrated in FIGS. 1 and 3, a single second-fourth contact part ICT14 may be disposed between the first-first and first-second through-holes TH11 and TH12, which are adjacent to each other in the first direction, and a single second-fifth contact part ICT15 may be disposed between the first-second and first-third through-holes TH12 and TH13, which are adjacent to each other in the first direction.

According to another embodiment, a plurality of second contact parts may be disposed between the first through-holes TH1:TH11 to TH13, which are adjacent to each other in the first direction. That is, although not illustrated, a plurality of second-fourth contact parts ICT14 may be disposed between the first-first through-hole TH11 and the first-second through-hole TH12, which are adjacent to each other in the first direction.

In addition, at least one first through-hole TH1: TH11 to TH13 may be disposed between the second contact parts, which are adjacent to each other in the first direction.

According to one embodiment, as illustrated in FIGS. 1 and 3, a single first-second through-hole TH12 may be disposed between the second-fourth and second-fifth contact parts ICT14 and ICT15, which are adjacent to each other in the first direction.

According to another embodiment, a plurality of first through-holes TH1 may be disposed between a plurality of second contact parts, which are adjacent to each other in the first direction. For example, although not illustrated, a plurality of first-second through-holes TH12 may be disposed between the second-fourth contact part. ICT14 and the second-fifth contact part ICT15.

In addition, referring again to FIG. 1, the first planar shape of each of the second contact parts ICT11 to ICT15, which are electrically connected to the first conductive semiconductor layer 122 exposed through the contact hole CH, may be the same as or different from the third planar shape of the third through-hole TH3. For example, the first planar shape of each of the second contact parts ICT11 to ICT15 may include an oval shape, and the third planar shape of the third through-hole TH3 may include a circular shape, but the embodiment is not limited thereto.

In addition, the number of second contact parts ICT11 to ICT15 may be greater than the number of first through-holes TH1 and greater than the number of third through-holes TH3. For example, referring to FIG. 1, the number of second contact parts ICT11 to ICT15 is 5, the number of first through-holes TH1 is 3, and the number of third through-holes TH3 is 4, but the embodiment is not limited thereto. That is, the number of second contact parts ICT11 to ICT15 may be greater or less than 5, the number of first through-holes TH1 may be greater or less than 3, and the number of third through-holes TH3 may be greater or less than 4.

In addition, referring to FIG. 1, the second contact parts ICT11 to ICT13 and the third through-holes TH3 may be arranged on the same first horizontal line HL1 in the y-axis direction, which is the first direction. At this time, the number of second contact parts ICT11 to ICT13 arranged on the first horizontal line HL1 may be less than the number of third through-holes TH3. For example, the number of second contact parts ICT11 to ICT13 arranged on the first horizontal line HL1 may be 3, and the number of third through-holes TH3 may be 4, but the embodiment is not limited thereto.

In addition, the second contact parts ICT14 and ICT15 may be arranged on the second horizontal line HL2 in the y-axis direction, which is the first direction. At this time, the number of second contact parts ICT14 and ICT15 arranged on the second horizontal line HL2 may be less than, greater than, or equal to the number of second contact parts ICT11 to ICT13, which are arranged on the first horizontal line HL1. For example, the number of second contact parts arranged on the first horizontal line HL1 is 3 and the number of second contact parts arranged on the second horizontal line HL2 is 2, but the embodiment is not limited thereto. As will be described later, referring to FIG. 8, the number of second contact parts arranged on the first horizontal line HL1 may be 3, and the number of second contact parts arranged on the second horizontal line HL2 may also be 3. Thus, the number of second contact parts arranged on the first horizontal line HL1 may be equal to the number of second contact parts arranged on the second horizontal line HL2.

In addition, the first horizontal line HL1 and the second horizontal line HL2 illustrated in FIG. 1 may be parallel to each other, but the embodiment is not limited thereto.

As described above, the reason that the number of second contact parts ICT11 to ICT13 arranged on the first horizontal line HL1 is less than the number of third through-holes TH3 and that the number of second contact parts ICT14 and ICT15 arranged on the second horizontal line HL2 is less than the number of second contact parts ICT11 to ICT13 arranged on the first horizontal line HL1 is that the first electrode 130 includes the first contact parts ECT1 to ECT12. Through the presence of the first contact parts ECT1 to ECT12 or ECT13 to ECT16, the overall area of the first electrode 130 may be increased, despite the small number of second contact parts ICT11 to ICT15. This will be additionally described later with reference to Table 1.

The second contact parts ICT11 to ICT15 may have various features, in addition to the above-described features, and the embodiment is not limited thereto. That is, the second contact parts ICT11 to ICT15 and the third contact part 140 may have various features, so long as the first electrode 130 includes the first contact parts ECT1 to ECT16, which are spaced apart from each other, in addition to the second contact parts ICT11 to ICT15.

FIG. 8 illustrates a plan view of a light-emitting element 100C according to a further embodiment, FIG. 9 illustrates a cross-sectional view of the light-emitting element 100C illustrated in FIG. 8 taken along line IV-IV', FIG. 10 illustrates a cross-sectional view of the light-emitting element 100C illustrated in FIG. 8 taken along line V-V', FIG. 11 illustrates a cross-sectional view of the light-emitting element 100C illustrated in FIG. 8 taken along line VI-VI', and FIG. 12 illustrates an enlarged cross-sectional view of portion "C" illustrated in FIG. 10. In addition, the enlarged cross-sectional view of portion "B" illustrated in FIG. 9 is identical to that illustrated in FIG. 6.

Since the light-emitting element 100C according to the further embodiment is the same as the above-described light-emitting elements 100B and 100C, excluding a difference in the structure of the first electrode 130, the same reference numerals will be given to the same parts, and a repeated description thereof will be omitted. Thus, the above description related to the light-emitting elements 100A and 100B illustrated in FIGS. 1 to 7 may be applied to parts not described with reference to FIGS. 8 to 12.

The light-emitting element 100A or 100B illustrated in FIG. 1 or FIG. 7 includes the plurality of first contact parts ECT1 to ECT12 or ECT13 to ECT16, whereas the light-emitting element 100C illustrated in FIG. 8 includes a single first contact part ECT. That is, in the case of the light-emitting element 100A or 100B illustrated in FIG. 1 or FIG. 7, since the plurality of first contact parts ECT1 to ECT12 are disposed in a portion of the entire first area of the light-emitting structure 120, the entire first area of the light-emitting structure 120 may include a portion that is not mesa-etched. On the other hand, in the case of the light-emitting element 1000 illustrated in FIG. 8, since a single first contact part ECT is disposed in the entire first area of the light-emitting structure 120, the entire first area of the light-emitting structure 120 is mesa-etched. The first contact part ECT may be spaced apart from the first edge 112 of the substrate 110 by the first distance D1 in the first direction, and may be spaced apart from the second edge 114 of the substrate 110 by the second distance D2 in the second direction.

In addition, the light-emitting element 100A or 100B illustrated in FIG. 1 or FIG. 7 includes five second contact parts ICT11 to ICT15, whereas the light-emitting element 100C illustrated in FIG. 8 includes six second contact parts ICT11 to ICT16. Each of the second contact parts ICT11 to ICT16 may be disposed on the first conductive semiconductor layer 122, which is exposed by mesa-etching the second conductive semiconductor layer 126, the active layer 124, and a portion of the first conductive semiconductor layer 122, in the second area, which is located inside the first area EDGE of the light-emitting structure 120 in a plane, and may be electrically connected to the exposed first conductive semiconductor layer 122.

Hereinafter, the detailed structure of the first electrode 130 illustrated in FIGS. 8 and 10 will be described with reference to FIG. 12.

As illustrated in FIG. 12, the first electrode 130 may include the first contact part 132 or ECT and the second contact part 134 (e.g. ICT14). In addition, the first electrode 130 may further include the contact connection part 136.

The first contact part 132 or ECT is connected to the first conductive semiconductor layer 122, which is exposed by mesa etching, in the first area EDGE. The second contact part 134 (e.g. ICT14) may be buried in the contact hole CH so as to be connected to the first conductive semiconductor layer 122, which is exposed by mesa etching, in the second area located inside the first area EDGE in a plane.

The contact connection part 136 serves to electrically connect the first contact part 132 or ECT to the second contact part 134, ICT11, ICT13, ICT14 or ICT16, and also serves to electrically connect the second contact parts ICT11 to ICT16 to each other. For example, referring to FIG. 12, the contact connection part 136 may electrically connect the first contact part 132 or ECT to the second contact part 134 or ICT14.

To this end, the contact connection part 136 may be disposed on each of the side portion and the top portion of the light-emitting structure 120 to connect the first contact part ECT to the second contact part ICT11, ICT13, ICT14 or ICT16.

In addition, as illustrated in FIG. 12, the first contact part 132, the second contact part 134, and the contact connection part 136 of the first electrode 130 may be integrally formed with each other, but the embodiment is not limited thereto.

In the first electrode 130, each of the first contact part ECT and the second contact parts ICT11 to ICT16 may include an ohmic-contact material, and a separate ohmic layer may be disposed on or under each of the first contact part ECT and the second contact parts ICT11 to ICT16.

In addition, the first contact part ECT may surround at least one of the second contact parts ICT11 to ICT16 or the third contact part 140 when viewed in a planar shape. For example, as illustrated in FIG. 8, the first contact part ECT may surround all of the second contact parts ICT11 to ICT16 and the third contact part 140 when viewed in a planar shape, but the embodiment is not limited thereto.

For example, referring to FIG. 8, the second contact parts ICT11 to ICT13 may be arranged in the y-axis direction, which is the first direction, and the second contact parts ICT14 to ICT16 may also be arranged in the y-axis direction, which is the first direction. In addition, the second contact parts ICT11 and ICT14 may be arranged in the z-axis direction, which is the second direction, the second contact parts ICT12 and ICT15 may also be arranged in the z-axis direction, which is the second direction, and the second contact parts ICT13 and ICT16 may also be arranged in the z-axis direction, which is the second direction. However, the embodiment is not limited thereto, and the second contact parts may be arranged in at least one of the first direction or the second direction in various forms.

At this time, a first number of second contact parts arranged in the y-axis direction, which is the first direction, and a second number of second contact parts arranged in the z-axis direction, which is the second direction, may be the same as or different from each other. For example, referring to FIG. 8, the first number is 3 and the second number is 2, but the embodiment is not limited thereto.

In addition, the second contact parts ICT11 to ICT16 may be arranged in a symmetrical planar shape in the diagonal directions CXL1 and CXL2 about the center O of the light-emitting structure 120, but the embodiment is not limited thereto. When the second contact parts ICT11 to ICT16 are arranged in a symmetrical planar shape in the diagonal directions CXL1 and CXL2 about the center O of the light-emitting structure 120 as described above, the first conductive carrier may be uniformly distributed to the active layer 124.

In addition, the fourth distance D4, which is the minimum distance between the first contact part ECT and the second contact parts ICT11 to ICT16 in the first direction (e.g. the y-axis direction), the fifth distance D5, which is the minimum distance between the first contact part ECT and the second contact parts ICT11 to ICT16 in the second direction (e.g. the z-axis direction), the sixth distance D6, which is the distance between the second contact parts ICT11 to ICT16 in the first direction, and the seventh distance D7, which is the distance between the second contact parts ICT11 to ICT16 in the second direction are the same as the above description with reference to FIGS. 1 to 7.

In addition, the respective second contact parts ICT11 to ICT16 may have the same planar shape, as illustrated in FIG. 8, but the embodiment is not limited thereto. That is, according to another embodiment, the respective second contact parts ICT11 to ICT16 may have different planar shapes, unlike the illustration of FIG. 8.

In addition, the second planar shape of the first contact part ECT may be different from the first planar shape.

The first planar shape may include at least one of a circular shape, an oval shape, or a polygonal shape, but the embodiment is not limited thereto. As illustrated in FIG. 8, the second planar shape of the first contact part ECT may be a rectangular loop shape and the first planar shape of each of the second contact parts ICT11 to ICT15 may be a circular shape, but the embodiment is not limited thereto. For example, the planar shape of the light-emitting element 100C illustrated in FIG. 8 may be a rectangular shape, but the embodiment is not limited thereto.

In addition, the light-emitting elements 100A and 100B illustrated in FIGS. 1 to 7 may include three first-first to first-third through-holes TH11 to TH13, whereas the light-emitting element 100C illustrated in FIGS. 8 to 12 may include four first-first to first-fourth through-holes TH11 to TH14. It can be appreciated that, in the cases of FIGS. 1 and 7, the first-second through-hole TH12 is located, lower in the z-axis direction than the first-first and first-third through-holes TH11 and TH13, which are disposed closer to the first area EDGE of the light-emitting structure 120 than the first-second through-hole TH12, whereas, in the case of the light-emitting structure 120 illustrated in FIG. 8, the first-first to first-fourth through-holes TH11, TH12, TH13 and TH14 are disposed on the same second horizontal line HL2 in the z-axis direction. Since the number of second contact parts ICT14, ICT15 and ICT16 disposed under the first bonding pad 162 in the thickness direction of the light-emitting structure 120 and the number of second contact parts ICT11 to ICT13 disposed under the second bonding pad 164 in the thickness direction of the light-emitting structure 120 are the same as each other, the first conductive carrier may be uniformly supplied to the active layer 124 even if the first-first to first-fourth through-holes TH11, TH12, TH13 and TH14 are disposed on the same second horizontal line HL2 about the z-axis, unlike the illustration of FIGS. 1 and 7.

In addition, the second-sixth contact part ICT16 may have a cross-sectional shape so as to be disposed between the third contact parts 140, which are respectively located under the first-third through-hole TH13 and the first-fourth through-hole TH14. That is, at least one second-sixth contact part ICT16 may be disposed between the first-third and first-fourth through-holes TH13 and TH14, which are adjacent to each other in the first direction. In addition, at least one first-third through-hole TH13 may be disposed between the second-fifth and second-sixth contact parts ICT15 and ICT16, which are adjacent to each other in the first direction.

In addition, in the same manner as the light-emitting elements 100A and 100B illustrated in FIGS. 1 and 7, in the case of the light-emitting element 100C illustrated in FIG. 8, the number of second contact parts ICT11 to ICT13 arranged on the first horizontal line HL1 is less than the number of third through-holes TH3, and the number of second contact parts ICT14 to ICT16 arranged on the second horizontal line HL2 is less than the number of first through-holes TH1. This is because the first electrode 130 includes the first contact part ECT. Through the provision of the first contact part ECT, the overall area of the first electrode 130 may be increased, despite a small number of second contact parts ICT11 to ICT16. This will be additionally described with reference to Table 2.

The second contact parts ICT11 to ICT16 may have various features, in addition to the above-described features, and the embodiment is not limited thereto. That is, the second contact parts ICT11 to ICT16 and the third contact part 140 may have various features, so long as the first electrode 130 may include a single first contact part ECT, in addition to the second contact parts ICT11 to ICT16.

Hereinafter, a method of manufacturing the light-emitting element 100A illustrated in FIGS. 1 to 6 will be described with reference to FIGS. 13a to 13f. However, needless to say, the embodiment is not limited thereto, and the light-emitting element 100A illustrated in FIGS. 1 to 6 may also be manufactured by another manufacturing method. In addition, the light-emitting element 100B illustrated in FIG. 7 may also be manufactured by the manufacturing method of the light-emitting element 100A, which will be described below.

FIGS. 13a to 13f illustrate process cross-sectional views for explaining a method of manufacturing the light-emitting element 100A illustrated in FIG. 2.

Referring to FIG. 13a, the light-emitting structure 120 is formed on the substrate 110. Here, as illustrated in FIG. 13a, the light-emitting structure 120 may be formed by sequentially stacking the first conductive semiconductor layer 122, the active layer 124, and the second conductive semiconductor layer 126 on the substrate 110.

Subsequently, referring to FIG. 13b, a plurality of mesa-etched holes M1, M2, M3, M4 and M5 is formed to expose the first conductive semiconductor layer 122 by mesa-etching the second conductive semiconductor layer 126, the active layer 124, and a portion of the first conductive semiconductor layer 122. Here, the holes M1 and M5, formed in the first area which is the edge area of the light-emitting structure 120, correspond to the area in which the first contact parts illustrated in FIG. 1 (e.g. ECT12 and ECT4 illustrated in FIG. 2) are to be formed, and the holes M2 to M4, formed in the second area inside the first area of the light-emitting structure 120 in a plane, correspond to the area in which the second contact parts (e.g. ICT11 to ICT13 illustrated in FIG. 2) are to be formed. At this time, only the area in which the first contact parts ECT1 to ECT12 are to be disposed may be mesa-etched in the entire first area EDGET of the light-emitting structure 120 defined by the first and second boundaries EDGE1 and EDGE2. Thus, it can be appreciated that a reduction in the area of the active layer 124, which is removed in order to form the first contact parts ECT1 to ECT12, may be minimized since the entire first area EDGET is not mesa-etched.

Subsequently, referring to FIG. 13c, the third contact part 140, which is the second electrode, is formed on the second conductive semiconductor layer 126. The third contact part 140 may be formed by being stacked on the second conductive semiconductor layer 126 around each of the mesa-etched holes M1, M2, M3, M4 and M5.

Since the first contact parts ECT1 to ECT12 are formed only in a portion of the entirety EDGET of the first area EDGE, the planar area in which the third contact part 140 is to be disposed may be increased.

Subsequently, referring to FIG. 13d, inside the mesa-etched holes M1 to M5, the contact hole CH is formed to expose the first conductive semiconductor layer 122, the second through-hole TH2 is formed to expose the top portion of the third contact part 140, and the first insulation layer 152 is formed on the side portion and the top portion of the light-emitting structure 120.

Subsequently, referring to FIG. 13e, a material for the formation of the first electrode 130 is formed on the top front surface of the first insulation layer 152 excluding the fourth through-hole TH4, on the first conductive semiconductor layer 122 exposed in a portion of the entire first area EDGET of the light-emitting structure 120, and in the contact hole CH exposed in the second area, which is located inside the first area of the light-emitting structure 120 in a plane, so as to form the first electrode 130, which is electrically connected to the first conductive semiconductor layer 122.

That is, second contact layers ICT11 to ICT15, which are to be connected to the first conductive semiconductor layer 122, are formed by filling the contact hole CH with the material for the formation of the first electrode 130. In addition, a plurality of first contact layers ECT1 to ECT12 is formed by depositing the material for the formation of the first electrode 130 on the first conductive semiconductor layer 122, which is exposed in the hole in the mesa-etched area, in the first area of the light-emitting structure 120. In addition, the contact connection part 136, which connects the first contact layers ECT1 to ECT12 to the second contact layers ICT11, ICT13, ICT14 and ICT15 and also connects the second contact layers ICT11 to ICT15 to each other, may be formed by depositing the material for the formation of the first electrode 130 on the side portion and the top portion of the light-emitting structure 120.

Subsequently, referring to FIG. 13f, the second insulation layer 154 is formed on the resulting product illustrated in FIG. 13e. At this time, the second insulation layer 154 is formed so that the contact connection part 136 of the first electrode 130 is exposed through the first through-hole TH1 and so that the second through-hole TH2 and the third contact part 140 are exposed through the third through-hole TH3.

Subsequently, the first and second bonding pads 162 and 164 are formed on the resulting product illustrated in FIG. 13f, whereby the light-emitting element 100A is completed.

Hereinafter, a method of manufacturing the light-emitting element 100C illustrated in FIGS. 8 to 12 will be described with reference to FIGS. 13a to 13f and FIGS. 14a to 14f. However, needless to say, the embodiment is not limited thereto, and the light-emitting element 100C illustrated in FIGS. 8 to 12 may also be manufactured by another manufacturing method.

FIGS. 14a to 14f illustrate process plan views for explaining a method of manufacturing the light-emitting element 100C illustrated in FIG. 8.

The process cross-sectional views for explaining a method of manufacturing the light-emitting element 100C illustrated in FIG. 9 are the same as FIGS. 13a to 13f.

Referring to FIGS. 13a and 14a, the light-emitting structure 120 is formed on the substrate 110. Here, as illustrated in FIG. 13a, the light-emitting structure 120 may be formed by sequentially stacking the first conductive semiconductor layer 122, the active layer 124, and the second conductive semiconductor layer 126 on the substrate 110. In this case, as illustrated in FIG. 14a, only the second conductive semiconductor layer 126, which is the uppermost layer in the planar shape of the light-emitting element 100C, is visible.

Subsequently, referring to FIGS. 13b and 14b, a plurality of mesa-etched holes M1, M2, M3, M4 and M5 is formed to expose the first conductive semiconductor layer 122 by mesa-etching the second conductive semiconductor layer 126, the active layer 124, and a portion of the first conductive semiconductor layer 122. Here, the holes M1 and M5, formed in the first area at the edge of the light-emitting structure 120, correspond to the area in which the first contact part ECT illustrated in FIG. 8 is to be formed, and the holes M2 to M4, formed in the second area inside the first area of the light-emitting structure 120 in a plane, correspond to the area in which the second contact parts ICT11 to ICT13 are to be formed. Here, the planar area of the second conductive semiconductor layer 126 illustrated in FIG. 14b may correspond to the first planar area of the active layer 124.

Subsequently, referring to FIGS. 13c and 14c, the third contact part 140, which is the second electrode, is formed on the second conductive semiconductor layer 126. The third contact part 140 may be formed by being stacked on the second conductive semiconductor layer 126 around each of the mesa-etched holes M1, M2, M3, M4 and M5.

Subsequently, referring to FIGS. 13d and 14d, inside the mesa-etched holes M1 to M5, the contact hole CH is formed to expose the first conductive semiconductor layer 122, the second through-hole TH2 is formed to expose the top portion of the third contact part 140, and the first insulation layer 152 is formed on the side portion and the top portion of the light-emitting structure 120. In FIG. 14d, each of the third contact part 140 and the second conductive semiconductor layer 126, which are covered with the first insulation layer 152, is represented by the dotted line.

Subsequently, referring to FIGS. 13e and 14e, a material for the formation of the first electrode 130 is formed on the top front surface of the first insulation layer 152 excluding the fourth through-hole TH4, on the first conductive semiconductor layer 122 exposed in the first area of the light-emitting structure 120, and in the contact hole CH exposed in the second area of the light-emitting structure 120, so as to form the first electrode 130, which is electrically connected to the first conductive semiconductor layer 122.

That is, the second contact parts ICT11 to ICT16, which are to be connected to the first conductive semiconductor layer 122, are formed by filling the contact hole CH with the material for the formation of the first electrode 130. In addition, the first contact part ECT is formed by depositing the material for the formation of the first electrode 130 on the first conductive semiconductor layer 122, which is exposed in the mesa-etched holes M1 and M5 in the first area of the light-emitting structure 120. In addition, the contact connection part 136, which connects the first contact part ECT to the second contact parts ICT11, ICT13, ICT14 and ICT16 and also connects the second contact parts ICT11 to ICT16 to each other, may be formed by depositing the material for the formation of the first electrode 130 on the side portion and the top portion of the light-emitting structure 120. In FIG. 14e, the respective boundaries of the first insulation layer 152, the second conductive semiconductor layer 126, and the third contact part 140, which are covered with the material for the formation of the first electrode 130, are represented by the dotted line.

Subsequently, referring to FIGS. 13f and 14f, the second insulation layer 154 is formed on the resulting product illustrated in FIGS. 13e and 14e. At this time, the second insulation layer 154 is formed so that the contact connection part 136 of the first electrode 130 is exposed through the first through-hole TH1 and so that the second through-hole TH2 and the third contact part 140 are exposed through the third through-hole TH3.

Subsequently, as illustrated in FIG. 8, the first and second bonding pads 162 and 164 are formed on the resulting product illustrated in FIGS. 13f and 14f, whereby the light-emitting element 100C is completed.

Hereinafter, the light-emitting element package 200 according to an embodiment will be described with reference to the accompanying drawings.

FIG. 15 illustrates a cross-sectional view of the light-emitting element package 200 according to an embodiment.

The light-emitting element package 200 illustrated in FIG. 15 may include the light-emitting element 100A or 100C, first and second solder parts 172 and 174, a package body 210, an insulation portion 212, first and second lead frames 222 and 224, and a molding member 230.

The light-emitting element illustrated in FIG. 15 corresponds to the light-emitting element 100A illustrated in FIG. 4 or the light-emitting element 100C illustrated in FIG. 11, and thus the same reference numerals will be given to the same parts and a repeated description thereof will be omitted. In addition, the light-emitting element package 200 illustrated in FIG. 15 may include the light-emitting element 100B illustrated in FIG. 7, instead of the light-emitting element 100A or 100C illustrated in FIG. 1 or FIG. 8.

The package body 210 may define a cavity CV. For example, as illustrated in FIG. 15, the package body 210 may define the cavity CV in conjunction with the first and second lead frames 222 and 224. That is, the cavity CV may be defined by the inner side surface of the package body 210 and the respective top surfaces of the first and second lead frames 222 and 224. However, the embodiment is not limited thereto. According to another embodiment, unlike the illustration of FIG. 15, the package body 210 may define the cavity CV alone. Alternatively, a barrier wall (not illustrated) may be disposed on the package body 210 having a flat top surface so that a cavity is defined by the barrier wall and the top surface of the package body 210. Although the package body 210 may be formed of, for example, an epoxy molding compound (EMC), the embodiment is not limited as to the material of the package body 210.

When the light-emitting element package 200 illustrated in FIG. 15 includes the light-emitting element 100A illustrated in FIG. 1, the first bonding pad 162 is connected to the first contact parts ECT1 to ECT12 and the second contact parts ICT11 to ICT15 through the contact connection part 136. Thus, the first bonding pad 162 may be electrically connected to the first conductive semiconductor layer 122 via the first contact parts ECT1 to ECT12 and the second contact parts ICT11 to ICT15.

Alternatively, when the light-emitting element package 200 illustrated in FIG. 15 includes the light-emitting element 100C illustrated in FIG. 8, the first bonding pad 162 is connected to the first contact part ECT and the second contact parts ICT11 to ICT16 through the contact connection part 136. Thus, the first bonding pad 162 may be electrically connected to the first conductive semiconductor layer 122 via the first contact part ECT and the second contact parts ICT11 to ICT16.

In addition, the second bonding pad 164 may be electrically connected to the second conductive semiconductor layer 126 via the third contact part 140.

In addition, the first solder part 172 may be electrically connected to the first conductive semiconductor layer 122 via the first bonding pad 162, and the second solder part 174 may be electrically connected to the second conductive semiconductor layer 126 via the second bonding pad 164. Thus, in addition, the first solder part 172 may be electrically connected to the first lead frame 222, and the second solder part 174 may be electrically connected to the second lead frame 224.

That is, the first solder part 172 may be disposed between the first lead frame 222 and the first bonding pad 162 so as to electrically connect the two 162 and 222 to each other, and the second solder part 174 may be disposed between the second lead frame 224 and the second bonding pad 164 so as to electrically connect the two 164 and 224 to each other.

Each of the first solder part 172 and the second solder part 174 may be a solder paste or a solder ball.

The first and second lead frames 222 and 224 may be spaced apart from each other in the second direction (e.g. the z-axis direction). Each of the first and second lead frames 222 and 224 may be formed of a conductive material, for example, a metal, and the embodiment is not limited as to the type of the material of each of the first and second lead frames 222 and 224. In order to electrically separate the first and second lead frames 222 and 224, the insulation portion 212 may be disposed between the first and second lead frames 222 and 224.

In addition, when the package body 210 is formed of a conductive material, for example, a metal, the first and second lead frames 222 and 224 may constitute a portion of the package body 210. Even in this case, portions of the package body 210 that form the first and second lead frames 222 and 224 may be electrically separated from each other by the insulation portion 212.

The insulation portion 212 may include at least one of $SiO_2$, $TiO_2$, $ZrO_2$, $Si_3N_4$, $Al_2O_3$ or $MgF_2$, but the embodiment is not limited to a particular material of the insulation portion 212.

The first and second solder parts 172 and 174 described above may electrically connect the first and second conductive semiconductor layers 122 and 126 to the first and second lead frames 222 and 224 through the first and second bonding pads 162 and 164 respectively, thereby eliminating the need for wires. However, according to another embodiment, the first and second conductive semiconductor layers 122 and 126 may be electrically connected to the first and second lead frames 222 and 224 using wires, respectively.

In addition, the first solder part 172 and the second solder part 174 may be omitted. In this case, the first bonding pad 162 may serve as the first solder part 172, and the second bonding pad 164 may serve as the second solder part 174. When the first solder part 172 and the second solder part 174 are omitted, the first bonding pad 162 may be directly connected to the first lead frame 222, and the second bonding pad 164 may be directly connected to the second lead frame 224.

Meanwhile, the molding member 230 may surround and protect the light-emitting element 100A or 100C, the first solder part 172, and the second solder part 174. The molding member 230 may be formed of, for example, silicon (Si), and may change the wavelength of light emitted from the light-emitting element 100A or 100C because it includes a fluorescent substance. The fluorescent substance may include any wavelength change material that may change the light generated in the light-emitting element 100A or 100C into white light such as a YAG-based, TAG-based, silicate-based, sulfide-based, or nitride-based fluorescent substance, but the embodiment is not limited as to the type of the fluorescent substance.

The YAG-based and TAG-based fluorescent substances may be selected from among (Y, Tb, Lu, Sc, La, Gd, Sm)3(Al, Ga, In, Si, Fe)5(O, S)12:Ce, and the silicate-based fluorescent substance may be selected from among (Sr, Ba, Ca, Mg)2SiO4: (Eu, F, Cl).

In addition, the sulfide-based fluorescent substance may be selected from among (Ca, Sr)S:Eu and (Sr, Ca, Ba) (Al, Ga)2S4:Eu, and the nitride-based fluorescent substance may be selected from among (Sr, Ca, Si, Al, O)N:Eu (e.g. CaAlSiN4:Eu β-SiAlON:Eu) and (Cax, My)(Si, Al)12(O,N) 16, which is based on Ca-α SiAlON:Eu (where M is at least one material of Eu, Tb, Yb, or Er, $0.05<(x+y)<0.3$, $0.02<x<0.27$, and $0.03<y<0.3$).

As a red fluorescent substance, a nitride-based fluorescent substance including N (e.g. $CaAlSiN_3$:Eu) may be used. Such a nitride-based red fluorescent substance may have higher reliability with respect to the external environment such as heat and moisture, and lower discoloration possibility than a sulfide-based fluorescent substance.

Hereinafter, a light-emitting element according to a comparative example and the light-emitting elements 100A, 100B and 100C according to the embodiments will be described with reference to the accompanying drawings.

FIG. 16 illustrates a plan view of a light-emitting element according to a comparative example.

The light-emitting element according to the comparative example illustrated in FIG. 16 includes a substrate 10, an insulation layer 20, a p-type electrode 30, and an n-type electrode 40. Here, although not illustrated, the p-type electrode 30 is connected to a p-type bonding pad (not illustrated), and the n-type electrode 40 is electrically connected to an n-type bonding pad (not illustrated). In addition, the n-type electrode 40 is electrically connected to a plurality of n-type inner contact layers ICT, which is electrically connected to an n-type semiconductor layer (not illustrated). The insulation layer 20 serves to electrically separate the p-type bonding pad and the n-type electrode 40 from each other.

Here, each of the substrate 10, the insulation layer 20, the p-type electrode 30, the n-type electrode 40, the p-type bonding pad, the n-type bonding pad, and the n-type inner contact layers ICT may perform the same function as each of the substrate 110, the second insulation layer 154, the third contact part 140 exposed through the third throughhole TH3, the contact connection part 136 exposed through the first through-hole TH1, the second bonding pad 164, the first bonding pad 162, and the second contact part 134 illustrated in FIG. 1, FIG. 7 or FIG. 8.

The light-emitting element according to the comparative example illustrated in FIG. 16 does not include the first contact parts ECT1 to ECT16 or the first contact part ECT, unlike the light-emitting elements 100A, 100B and 100C according to the embodiments, and includes a greater number of n-type inner contact layers ICT than the light-emitting elements 100A, 100B and 100C according to the embodiments.

As illustrated in FIG. 16, when the n-type inner contact layers ICT are uniformly disposed throughout the surface of the light-emitting element, current may be uniformly distributed. However, when the n-type inner contact layers ICT are disposed throughout the surface of the light-emitting element, the area of the active layer (not illustrated) may be reduced, and the loss of the area of the p-type electrode 30, which serves as a light-reflecting layer, may be increased.

On the other hand, when the light-emitting elements 100A, 100B and 100C according to the embodiments illustrated in FIG. 1, FIG. 7 and FIG. 8 include the first contact pails ECT1 to ECT12 or ECT13 to ECT16, or the first contact part ECT, the number of n-type inner contact layers ICT illustrated in FIG. 16 may be reduced. That is, it can be appreciated that the number of second contact parts ICT11 to ICT16 illustrated in FIG. 1. FIG. 7 or FIG. 8 is less than the number of inner contact layers ICT illustrated in FIG. 16. When the number of second contact parts is reduced on the front surface of the light-emitting structure 120, it is possible to reduce the loss of the area of each of the first electrode 130, the active layer 124, and the third contact part 140, which serves as a light-reflecting layer.

When the planar area of the light-emitting elements 100A, 100B and 100C is large, the loss of the area of each of the first electrode 130, the active layer 124, and the third contact part 140 may be further reduced. However, when the size of the light-emitting element is, for example, as small as about 1000 μm×1000 μm (ΔY×ΔZ), the area ratio of the first contact parts ECT1 to ECT12 or ECT13 to ECT16, or the first contact part ECT, having low reflectance, may be increased, which may not increase the output of light. In order to prevent this, as illustrated in FIG. 1 or 7, the first contact parts ECT1 to ECT12 or ECT13 to ECT16 may be disposed in a portion of the first area of the light-emitting structure 120, rather than being disposed over the entire first area. Thus, the output of light may be increased even when the light-emitting element 100A or 100B illustrated in FIG. 1 or FIG. 7 has a small planar area.

Alternatively, when the size of the light-emitting element is, for example, as large as about 1400 μm×1400 μm (ΔY×ΔZ), as illustrated in FIG. 8, the first contact part ECT may be disposed over the entire first area.

In addition, when the ratio of the second planar area of the first contact parts ECT1 to ECT12 or ECT13 to ECT16 or the first contact part ECT to the first planar area of the active layer 124 is greater than 2%, the amount of light absorbed by the first contact parts ECT1 to ECT12 of ECT13 to ECT16 or the first contact part ECT may be increased, causing an increase in the loss of light. Therefore, the ratio of the second planar area to the first planar area may be within 2%, but the embodiment is not limited thereto.

In addition, in order to reduce the loss of the area of the active layer 124 and the third contact part 140, the third planar area of the second contact parts ICT11 to ICT16 may be less than the second planar area of the first contact parts ECT1 to ECT12 or ECT13 to ECT16 or the first contact part ECT, but the embodiment is not limited thereto.

In addition, the various features of the first contact parts ECT1 to ECT12 or ECT13 to ECT16 or the first contact part ECT and the second contact parts ICT11 to ICT16 described above, for example, at least one of the size, the number and shape of the first contact parts ECT1 to ECT12 or ECT13 to ECT16 or the first contact part ECT, the size, number and shape of the second contact parts ICT11 to ICT16, the distances Dmin and Dmax, the first width W1, the second width W2, the third-first width W3Y, the third-second width W3Z, the first to seventh distances D1 to D7, the first length. L1, the second length L2, or the number of first or third through-holes TH1 or TH3 may be determined so that the ratio of the second planar area to the first planar area is within 2%.

Hereinafter, the results of inspecting the performances of the light-emitting elements 100A, 100B and 100C according to the embodiments and the light-emitting element according to a first comparative example are represented in the following Table 1. In Table 1, data regarding Vf, Po, and WPE indicate the percentages of each of first and second embodiments on the basis of the first comparative example.

TABLE 1

| Sort | When current supplied to light-emitting element is 1A | | |
|---|---|---|---|
| | Vf(%) | Po(%) | WPE(%) |
| First Comparative Example | 100 | 100 | 100 |
| First Embodiment | 97.45 | 93.98 | 96.8 |
| Second Embodiment | 99.04 | 99.21 | 100.27 |

Here, the first comparative example is the case in which the light-emitting element includes no first contact part, as illustrated in FIG. 16, and the first embodiment is the case in which the light-emitting element 100C includes the first contact part ECT disposed in the entire edge area, i.e. the entire first area, of the light-emitting structure 120, as illustrated in FIG. 8. That is, the light-emitting element 100C according to the first embodiment includes a single first contact part ECT formed in the first area along the edge of the light-emitting structure 120. The second embodiment is the case in which the first contact parts ECT1 to ECT12 or ECT13 to ECT16 are included in a portion of the first area at the edge of the light-emitting structure 120, as illustrated in FIG. 1 or FIG. 7. In addition, in Table 1, Vf is the forward bias voltage of the light-emitting element, Po is the output of light, and wall-plug efficiency (WPE) is luminous efficacy.

Referring to Table 1 described above, it can be appreciated that the light-emitting elements 100A and 100B according to the second embodiment have excellent light extraction efficiency Po, compared to the light-emitting element 100C according to the first embodiment and the light-emitting element according to the first comparative example.

Hereinafter, the results of inspecting the performances of the light-emitting elements according to the first embodiment illustrated in FIG. 8 and the first comparative example illustrated in FIG. 16 are represented in the following Table 2. In Table 2, data regarding Vf, Po, and WPE indicate the percentages of a first-first example on the basis of a first-first comparative example and the percentages of a first-second embodiment on the basis of a first-second comparative example.

element"), and was increased to 1916% When the size of the element was small (i.e. 1000 μm×1000 μm)(referred to as the "small element") (see "AT Ratio" of Table 2).

In addition, compared to the first-first and first-second comparative examples, in the case of the light-emitting element 100C of the first-first and first-second examples, the area A1 of the active layer 124 was increased to 100.2% in the large element and was increased to 100.5% in the small element (see "A1 Ratio" of Table 2).

In addition, compared to the first-first and first-second comparative examples, in the case of the light-emitting element 100C of the first-first and first-second examples, the area A4 of the third contact part 140, which is the second electrode, was increased to 104.7% in the large element and was increased to 103.5% in the small element (see "A4 Ratio" of Table 2).

In addition, it can be satisfied that the ratio of the second planar area A2 to the first planar area A1 in the large element rather than the small element is equal to or less than 2%.

A plurality of light-emitting element packages according to the embodiment may be arranged on a board, and optical members such as a light guide plate, a prism sheet, and a

TABLE 2

| | | Size($\Delta Y \times \Delta Z$) | | | |
| --- | --- | --- | --- | --- | --- |
| | | 1400 μm × 1400 μm | | 1000 μm × 1000 μm | |
| Sort | | First-First Comparative Example | First-First Embodiment | First-Second Comparative Example | First-Second Embodiment |
| First Electrode | A2(μm$^2$) | 0 | 27181.1947 (5 μm) | 0 | 22810.0884 (5 μm) |
| | A3(μm$^2$) | 25446.9 | 10998.3714 | 15268.14 | 6601.1708 |
| | AT = A2 + A3(μm$^2$) | 25446.9 | 38179.5661 | 15268.14 | 29411.2592 |
| | AT Ratio | | 150% | | 192.6% |
| Active Layer | A1 (μm$^2$) | 1796313.943 | 1799813.01 | 889551.1093 | 893919.2929 |
| | A1 Ratio | | 100.2% | | 100.5% |
| Second Electrode | A4(μm$^2$) | 1588633.147 | 1662866.329 | 785663.2803 | 813330.3446 |
| | A4 Ratio | | 104.7% | | 103.5% |
| Characteristics | Vf(%) | 100 | 99.69 | 100 | 98.49 |
| | Po(%) | 100 | 99.73 | 100 | 98.23 |
| | WPE(%) | 100 | 100.24 | 100 | 99.71 |
| | A2/A1 | | 1.5% | | 2.6% |

Here, the first-first comparative example is the case in which the number of n-type inner contact parts ICT illustrated in FIG. 16 is 25, the first-second comparative example is the case in which the number of n-type inner contact parts ICT illustrated in FIG. 16 is 15, the first-first embodiment is the case in which the number of second contact parts ICT illustrated in FIG. 8 is 6, the first-second embodiment is the case in which the number of second contact parts ICT illustrated in FIG. 8 is 4, "5 μm" written in the first-first and first-second embodiments in A2 is W1 (or W2), A1, A2, and A3 are respectively first, second, and third planar areas, A4 is the planar area of the third contact part 140 (or the p-type electrode 30 in FIG. 16), Vf is the forward bias voltage of the light-emitting element 100C, Po is the output of light, and wall-plug efficiency (WPE) is luminous efficacy and corresponds to a value obtained by dividing Po by the amount of introduced electricity.

Referring to the above-described Table 2, compared to the first-first and first-second comparative examples, in the case of the light-emitting element 100C of the first-first and first-second embodiments, the area AT of the first electrode 130 was increased to 150.5% when the size of the element was large (i.e. 1400 μm×1400 μm) (referred to as the "large diffuser sheet may be disposed on the optical path of the light-emitting element packages. The light-emitting element packages, the board, and the optical members may function as a backlight unit.

In addition, the light-emitting element according to the embodiments, and the light-emitting element package including the element may be included in a light-emitting apparatus such as a display apparatus, an indicator apparatus, and a lighting apparatus.

Here, the display apparatus may include a bottom cover, a reflector disposed on the bottom cover, a light-emitting module for emitting light, a light guide plate disposed in front of the reflector to guide light emitted from the light-emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module that includes a board and the light-emitting element package according to the embodiment, a radiator that dissipates heat of the light source module, and a power supply unit that processes or converts an electrical signal received from the outside to provide the same to the light source module. For example, the lighting apparatus may include a lamp, a headlamp, or a street light.

The headlamp may include a light-emitting module that includes light-emitting element packages disposed on a board, a reflector that reflects light emitted from the light-emitting module in a given direction, for example, in the forward direction, a lens that refracts light reflected by the reflector forward, and a shade that blocks or reflects some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

MODE FOR INVENTION

Modes for the implementation of embodiments have sufficiently been described in the "best mode" described above.

INDUSTRIAL APPLICABILITY

A light-emitting element and a light-emitting element package including the element according to the embodiments may be used in a light-emitting apparatus such as a display apparatus, an indicator apparatus, and a lighting apparatus.

The invention claimed is:
1. A light-emitting element comprising:
a substrate;
a light-emitting structure disposed on the substrate, the light-emitting structure comprising a first conductivity type semiconductor layer, an active layer, and a second conductivity type semiconductor layer; and
a first electrode and a second electrode configured to be electrically connected to the first conductivity type semiconductor layer and the second conductivity type semiconductor layer, respectively,
wherein the first conductivity type semiconductor layer includes a plurality of first upper surfaces exposed in a plurality of first recesses, respectively, and at least one second upper surface exposed in at least one second recess,
wherein the plurality of the first upper surfaces are positioned in a first area,
wherein the at least one second upper surface is disposed in a second area,
wherein the second area surrounds the first area in plan view,
wherein the second conductivity type semiconductor layer includes a third upper surface positioned in a third area, the second electrode being disposed on the third upper surface of the second conductivity type semiconductor layer,
wherein the second area surrounds the third area in plan view,
wherein the third area surrounds the first area in plan view,
wherein the first electrode comprises:
a plurality of first contact parts respectively disposed on the plurality of first upper surfaces of the first conductivity type semiconductor layer, so as to be configured to be electrically connected to the first conductivity type semiconductor layer;
at least one second contact part disposed on the at least one second upper surface of the first conductivity type semiconductor layer so as to be configured to be electrically connected to the first conductivity type semiconductor layer, and
a contact connection part disposed on a side portion and a top portion of the light-emitting structure, wherein the contact connection part is configured to interconnect the at least one second contact part and the first contact parts and to interconnect the first contact parts to each other, in a cross sectional view,
wherein the second electrode comprises a third contact part disposed on the third upper surface of the second conductivity type semiconductor layer so as to be configured to be electrically connected to the second conductivity type semiconductor layer, and
wherein the light-emitting element further comprises a first insulation layer disposed between each of the side portion and the top portion of the light-emitting structure and the contact connection part and disposed between the third contact part and the contact connection part.

2. The element according to claim 1, further comprising:
a first bonding pad connected to the first electrode; and
a second bonding pad connected to the second electrode and spaced apart from the first bonding pad.

3. The element according to claim 2, further comprising a second insulation layer disposed between the second bonding pad and the first electrode.

4. The element according to claim 3, wherein the second insulation layer comprises a first through-hole configured to expose the first electrode, and
wherein the first bonding pad is connected to the first electrode through the first through-hole.

5. The element according to claim 4, wherein the first through-hole exposes at least one of the at least one second contact part, each of the first contact parts, or the contact connection part, and
wherein the first bonding pad is connected to the exposed contact connection part.

6. The element according to claim 5, wherein the first insulation layer comprises a second through-hole configured to expose the third contact part,
wherein the second insulation layer comprises a third through-hole configured to expose the second through-hole, and
wherein the second bonding pad is connected to the third contact part exposed through the second and third through-holes.

7. The element according to claim 6, wherein the first contact parts and the third through-hole are arranged on the same first horizontal line in a first direction crossing a thickness direction of the light-emitting structure.

8. The element according to claim 7, wherein the first contact parts are arranged on the first horizontal line in a number smaller than a number of third through-holes.

9. The element according to claim 7, wherein at least some of the first contact parts and the first through-hole are arranged on the same second horizontal line in the first direction.

10. The element according to claim 9, wherein the first contact parts are arranged on the second horizontal line in a number smaller than a number of first through-holes.

11. The element according to claim 9, wherein the first contact parts are arranged on the second horizontal line in a number smaller than a number of the first contact parts arranged on the first horizontal line.

12. The element according to claim 1, wherein the first contact parts have a third planar area less than a second planar area of the at least one second contact part.

13. The element according to claim 1, wherein the at least one second contact part surrounds at least one of the first contact parts or the third contact part.

14. The element according to claim 1, wherein the at least one second recess includes a plurality of second recesses,
wherein the at least one second upper surface includes a plurality of second upper surfaces exposed in the plurality of second recesses, respectively, and
wherein the at least one second contact part comprises a plurality of second contact parts disposed on the plurality of second upper surfaces of the first conductivity type semiconductor layer, respectively.

15. The element according to claim 1, wherein the at least one second contact part is disposed at a distance equal to or greater than a threshold distance from the first contact parts.

16. The element according to claim 15, wherein the threshold distance is an average value or an intermediate value of a maximum distance and a minimum distance between the at least one second recess of the light-emitting structure and the first contact parts.

17. A light-emitting element package comprising:
the light-emitting element according to claim 1; and
first and second lead frames electrically connected to the first and second electrodes, respectively.

18. A light-emitting element, comprising:
a substrate;
a light-emitting structure disposed on the substrate;
a first electrode and a second electrode configured to be electrically connected to the light-emitting structure,
wherein the light-emitting structure includes a first conductivity type semiconductor layer, an active layer disposed on the first conductivity type semiconductor layer, and a second conductivity type semiconductor layer disposed on the active layer, a plurality of recesses passing through the second conductivity type semiconductor layer, the active layer, and a portion of the first conductivity type semiconductor layer,
wherein the plurality of recesses includes a plurality of first recesses, and a second recess provided at a perimeter of the plurality of first recesses in a closed loop shape,
wherein the first electrode comprises:
a plurality of first parts disposed in each of the plurality of first recesses, wherein the plurality of first parts is configured to be electrically connected to the first conductivity type semiconductor layer;
a second part disposed in the second recess, wherein the second part is configured to be electrically connected to the first conductivity type semiconductor layer; and
a contact connection part disposed on a side portion and a top portion of the light-emitting structure, wherein the contact connection part is configured to interconnect the second part and the plurality of first parts and to interconnect the plurality of first parts to each other, in a cross sectional view, and
wherein the light-emitting element further comprises a first insulation layer disposed between each of the side portion and the top portion of the light-emitting structure and the contact connection part and disposed between the second electrode and the contact connection part,
wherein the second conductivity type semiconductor layer includes an upper surface, the upper surface surrounding the plurality of first parts of the first electrode in plan view, and
wherein the second electrode is disposed on the upper surface of the second conductivity type semiconductor layer, so as to be electrically connected to the second conductivity type semiconductor layer.

* * * * *